United States Patent
Cao et al.

(10) Patent No.: US 11,122,221 B2
(45) Date of Patent: Sep. 14, 2021

(54) SEMICONDUCTOR IMAGE DETECTOR HAVING REDUNDANT MEMORY AND/OR MEMORY BYPASS

(71) Applicant: SHENZHEN XPECTVISION TECHNOLOGY CO., LTD., Shenzhen (CN)

(72) Inventors: Peiyan Cao, Shenzhen (CN); Huabin Cheng, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 302 days.

(21) Appl. No.: 16/074,277

(22) PCT Filed: Feb. 26, 2016

(86) PCT No.: PCT/CN2016/074663
§ 371 (c)(1),
(2) Date: Jul. 31, 2018

(87) PCT Pub. No.: WO2017/143584
PCT Pub. Date: Aug. 31, 2017

(65) Prior Publication Data
US 2020/0280686 A1 Sep. 3, 2020

(51) Int. Cl.
*G11C 29/24* (2006.01)
*G01T 1/24* (2006.01)
(Continued)

(52) U.S. Cl.
CPC ............ *H04N 5/32* (2013.01); *H04N 5/37452* (2013.01); *G11C 29/04* (2013.01); *G11C 29/24* (2013.01)

(58) Field of Classification Search
CPC ....... G01T 1/2018; G01T 1/17; G01T 1/2985; G01T 1/1647; G01T 1/171; G01T 1/247;
(Continued)

(56) References Cited

U.S. PATENT DOCUMENTS

| 4,254,477 A | 3/1981 | Hsia et al. |
| 4,383,328 A * | 5/1983 | Kurihara ................ G03B 42/02 378/42 |

(Continued)

FOREIGN PATENT DOCUMENTS

| CN | 101086898 A | 12/2007 |
| CN | 101106659 A | 1/2008 |

(Continued)

*Primary Examiner* — Alison Slater
(74) *Attorney, Agent, or Firm* — IPro, PLLC; Qian Gu

(57) ABSTRACT

Disclosed herein is an apparatus suitable for detecting an image, comprising: a plurality of pixels configured to generate an electric signal upon exposure to a radiation; an electronics system associated with each of the pixels, wherein the electronics system comprises a first memory on a first signal path and a second memory on a second signal path, both signal paths being between an input terminal and an output terminal of the electronics system; wherein each of the first memory and the second memory is configured to store the electric signal generated by the pixel the electronics system is associated with, configured to store the electric signal generated in another pixel, and configured to transmit the electric signal stored in the electronics system to another pixel; wherein the electronics system comprises a switch configured to select one of the signal paths.

23 Claims, 30 Drawing Sheets

(51) Int. Cl.
 *H04N 5/32* (2006.01)
 *H04N 5/3745* (2011.01)
 *G11C 29/04* (2006.01)

(58) Field of Classification Search
 CPC ..... G01T 1/2928; G01T 1/2008; G01T 1/202;
  G01T 1/208; G01T 1/24; G01T 1/244;
  G01T 1/1648
 See application file for complete search history.

(56) References Cited

U.S. PATENT DOCUMENTS

| | | | | |
|---|---|---|---|---|
| 4,544,949 A * | 10/1985 | Kurihara | ............... | H05G 1/64 348/E5.089 |
| 5,063,378 A | 11/1991 | Roach | | |
| 7,577,885 B2 * | 8/2009 | Hasegawa | ............... | G11C 29/54 365/201 |
| 7,791,034 B2 * | 9/2010 | Kameshima | ...... | H01L 27/14663 250/370.09 |
| 7,797,591 B2 * | 9/2010 | Hasegawa | ............... | G11C 29/54 714/710 |
| 7,852,391 B2 * | 12/2010 | Tinkler | ................ | H04N 5/367 348/302 |
| 7,893,972 B2 | 2/2011 | Kaplinsky et al. | | |
| 2004/0165089 A1 * | 8/2004 | An | ............... | G01T 1/247 |
| 2006/0104417 A1 * | 5/2006 | Kameshima | ......... | A61B 6/5235 378/98 |
| 2007/0079052 A1 * | 4/2007 | Hasegawa | ............... | G11C 29/54 711/100 |
| 2008/0013686 A1 * | 1/2008 | Kameshima | ......... | G01T 1/2018 378/98 |
| 2009/0282285 A1 * | 11/2009 | Hasegawa | ............... | G11C 29/54 714/6.32 |
| 2013/0284927 A1 * | 10/2013 | Kryskowski | ............ | G01J 5/026 250/338.1 |
| 2014/0206994 A1 * | 7/2014 | Jain | ...................... | A61B 8/4254 600/437 |
| 2014/0361189 A1 * | 12/2014 | Kameshima | ............ | H04N 5/32 250/393 |
| 2015/0078508 A1 * | 3/2015 | Lee | ........................ | A61B 6/542 378/4 |
| 2015/0237277 A1 | 8/2015 | Honda et al. | | |
| 2015/0243791 A1 | 8/2015 | Itoh | | |
| 2015/0288907 A1 * | 10/2015 | Vampola | ............ | H04N 5/367 348/302 |
| 2015/0338531 A1 | 11/2015 | Niekawa | | |

FOREIGN PATENT DOCUMENTS

| | | | |
|---|---|---|---|
| CN | 101435874 A | | 5/2009 |
| CN | 103632729 A | | 3/2014 |
| CN | 3193542 A | | 10/2014 |
| CN | 106104302 B | * | 3/2020 |
| EP | 0588425 A2 | | 3/1994 |
| TW | 201428339 A | | 7/2014 |
| TW | 201606766 A | | 2/2016 |

\* cited by examiner

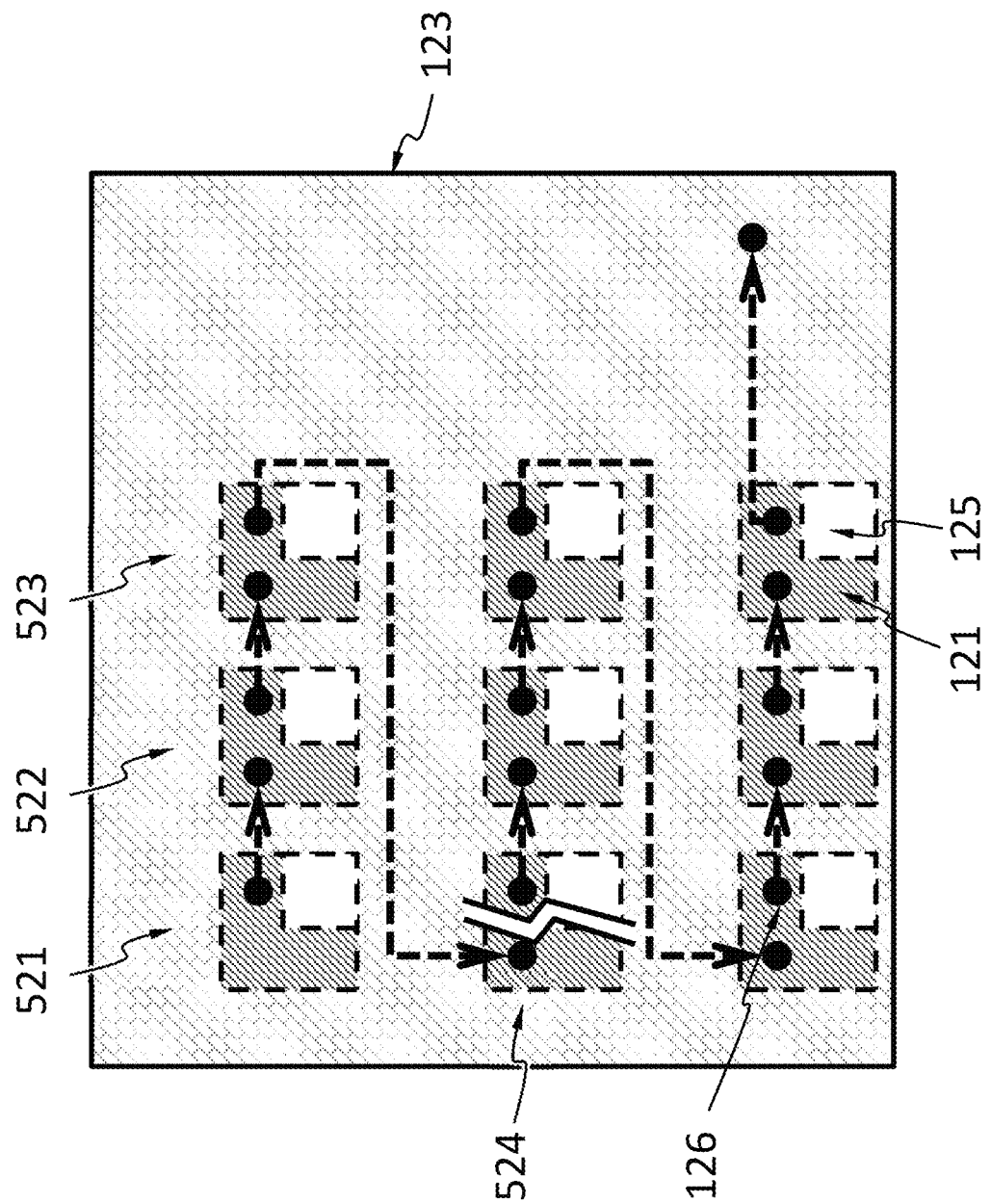

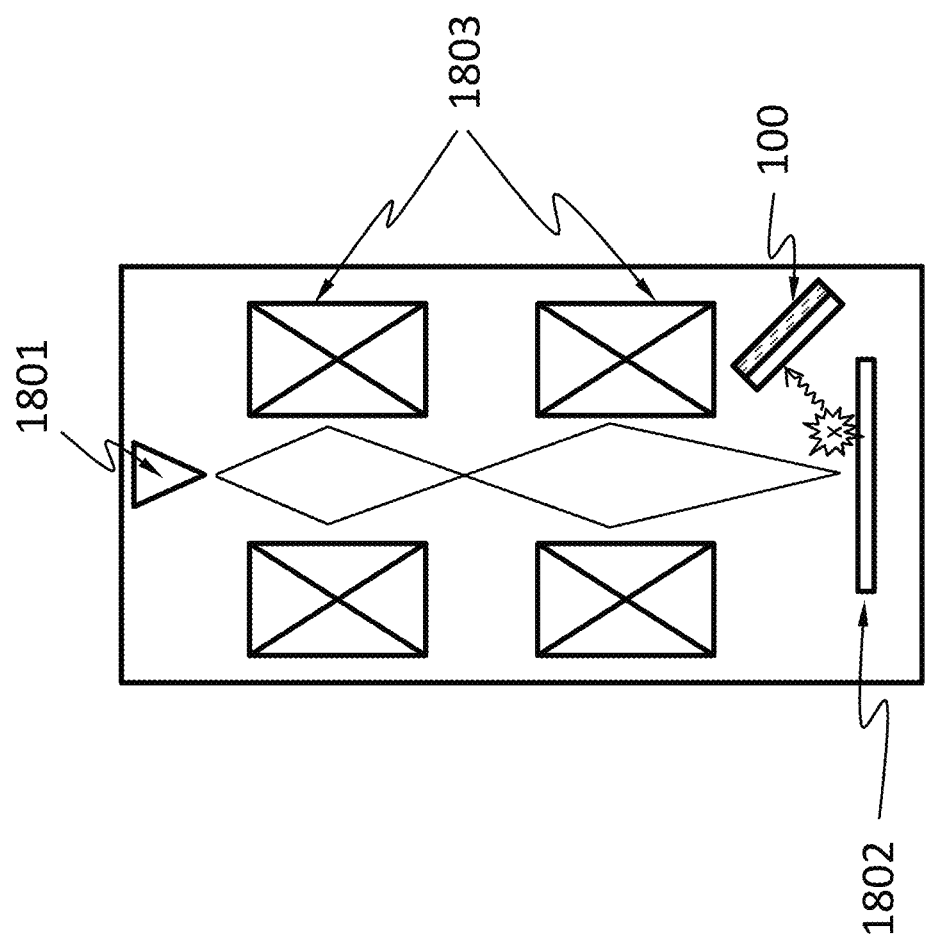

SEMICONDUCTOR IMAGE DETECTOR HAVING REDUNDANT MEMORY AND/OR MEMORY BYPASS

TECHNICAL DATA

The disclosure herein relates to methods of reading data from a semiconductor image detector, particularly a semiconductor X-ray image detector.

BACKGROUND

X-ray detectors may be devices used to measure the flux, spatial distribution, spectrum or other properties of X-rays.

X-ray detectors may be used for many applications. One important application is imaging. An X-ray detector that is configured to detect an X-ray image may be called an X-ray imaging detector. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is an apparatus suitable for detecting an image, comprising: a plurality of pixels configured to generate an electric signal upon exposure to a radiation; an electronics system associated with each of the pixels, wherein the electronics system comprises a first memory on a first signal path and a second memory on a second signal path, both signal paths being between an input terminal and an output terminal of the electronics system; wherein each of the first memory and the second memory is configured to store the electric signal generated by the pixel the electronics system is associated with, configured to store the electric signal generated in another pixel, and configured to transmit the electric signal stored in the electronics system to another pixel; wherein the electronics system comprises a switch configured to select one of the signal paths.

According to an embodiment, the input terminal is configured to receive signal into the electronics system and the output terminal is configured to transmit signal stored in the electronics system to downstream circuitry.

According to an embodiment, the first signal path is selected unless the first memory is defective.

According to an embodiment, the second signal path is selected when the first memory is defective.

According to an embodiment, the apparatus is configured to detect an X-ray image.

According to an embodiment, the electronics system comprises a memory configured to store a code representing a defectiveness state and a selection of the signal path. The memory may have redundancy.

According to an embodiment, the memory is a non-volatile memory.

According to an embodiment, the apparatus further comprises a memory configured to store codes representing defectiveness states and selection of signal paths of the plurality of electronics systems.

According to an embodiment, the memory is a non-volatile memory.

According to an embodiment, the apparatus further comprises a controller configured to select the signal paths in the plurality of electronics systems based on the codes representing a defectiveness state and a selection of the signal path. The codes representing a defectiveness state and a selection of the signal path may be stored in the memory configured to store these codes. The apparatus may be configured to select between the redundant memories, collectively for a group of electronics systems.

According to an embodiment, the memory is a removable dongle.

According to an embodiment, the apparatus is disabled unless the removable dongle is present.

According to an embodiment, the electronics system comprises a bypass path that connects the input terminal and the output terminal, without a memory on the bypass path; wherein the electronics system comprises a switch configured to select the first signal path, the second signal path or the bypass path.

Disclosed herein is an apparatus suitable for detecting an image, comprising: a plurality of pixels configured to generate an electric signal upon exposure to a radiation; an electronics system associated with each of the pixels, wherein the electronics system comprises a first memory on a signal path between an input terminal and an output terminal of the electronics system, wherein the first memory configured to store the electric signal generated by the pixel the electronics system is associated with, configured to store the electric signal generated in another pixel, and configured to transmit the electric signal stored in the electronics system to another pixel; wherein the electronics system comprises a bypass path that connects the input terminal and the output terminal, without a memory on the bypass path; wherein the electronics system comprises a switch configured to select the signal path or the bypass path.

According to an embodiment, the input terminal is configured to receive signal into the electronics system and the output terminal is configured to transmit signal stored in the electronics system to downstream circuitry.

According to an embodiment, the signal path is selected unless the first memory is defective.

According to an embodiment, the apparatus is configured to detect an X-ray image.

According to an embodiment, the electronics system comprises a memory configured to store a code representing a defectiveness state and a selection of the signal path or the bypass path.

According to an embodiment, the memory is a non-volatile memory.

According to an embodiment, the apparatus further comprises a memory configured to store codes representing defectiveness states and selection of signal paths or the bypass paths of the plurality of electronics systems.

According to an embodiment, the memory is a non-volatile memory.

The apparatus of claim 20, comprising a controller configured to select the signal paths or the bypass paths in the plurality of electronics systems based on the codes.

BRIEF DESCRIPTION OF FIGURES

FIG. 5A, FIG. 5B and FIG. 5C each show a failure mode.

FIG. 17 schematically shows an electron microscope comprising the semiconductor X-ray detector described herein, according to an embodiment.

DETAILED DESCRIPTION

Figure 1A:
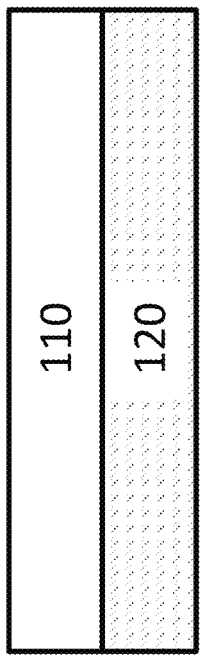
FIG. 1A schematically shows a cross-sectional view of an X-ray imaging detector, according to an embodiment.

FIG. 1A schematically shows a cross-sectional view of an X-ray image detector 100, according to an embodiment. The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 1B:
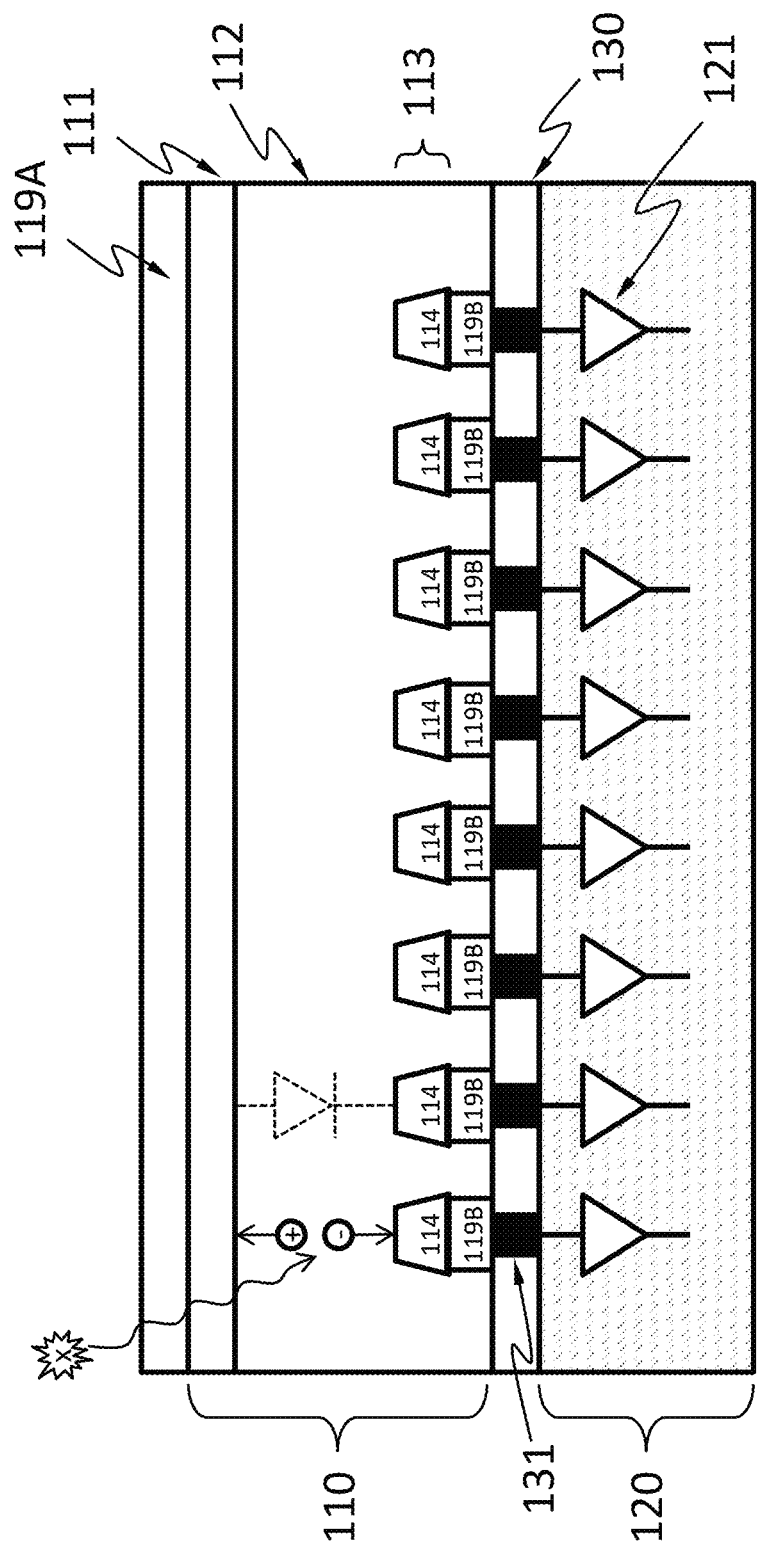
FIG. 1B schematically shows a detailed cross-sectional view of the detector, according to an embodiment.

As shown in a detailed cross-sectional view of the detector 100 in FIG. 1B, according to an embodiment, the X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the X-ray absorption layer 110 has a plurality of diodes having the first doped region 111 as a shared electrode. The first doped region 111 may also have discrete portions.

When an X-ray photon hits the X-ray absorption layer 110 including diodes, the X-ray photon may be absorbed and generate one or more charge carriers by a number of mechanisms. An X-ray photon may generate 10 to 100000 charge carriers. The charge carriers may drift to the electrodes of one of the diodes under an electric field. The field may be an external electric field. The electrical contact 119B may include discrete portions each of which is in electrical contact with the discrete regions 114. In an embodiment, the charge carriers may drift in directions such that the charge carriers generated by a single X-ray photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by an X-ray photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by an X-ray photon incident therein flow to the discrete region 114. Namely, less than 2%, less than 1%, less than 0.1%, or less than 0.01% of these charge carriers flow beyond the pixel.

Figure 1C:
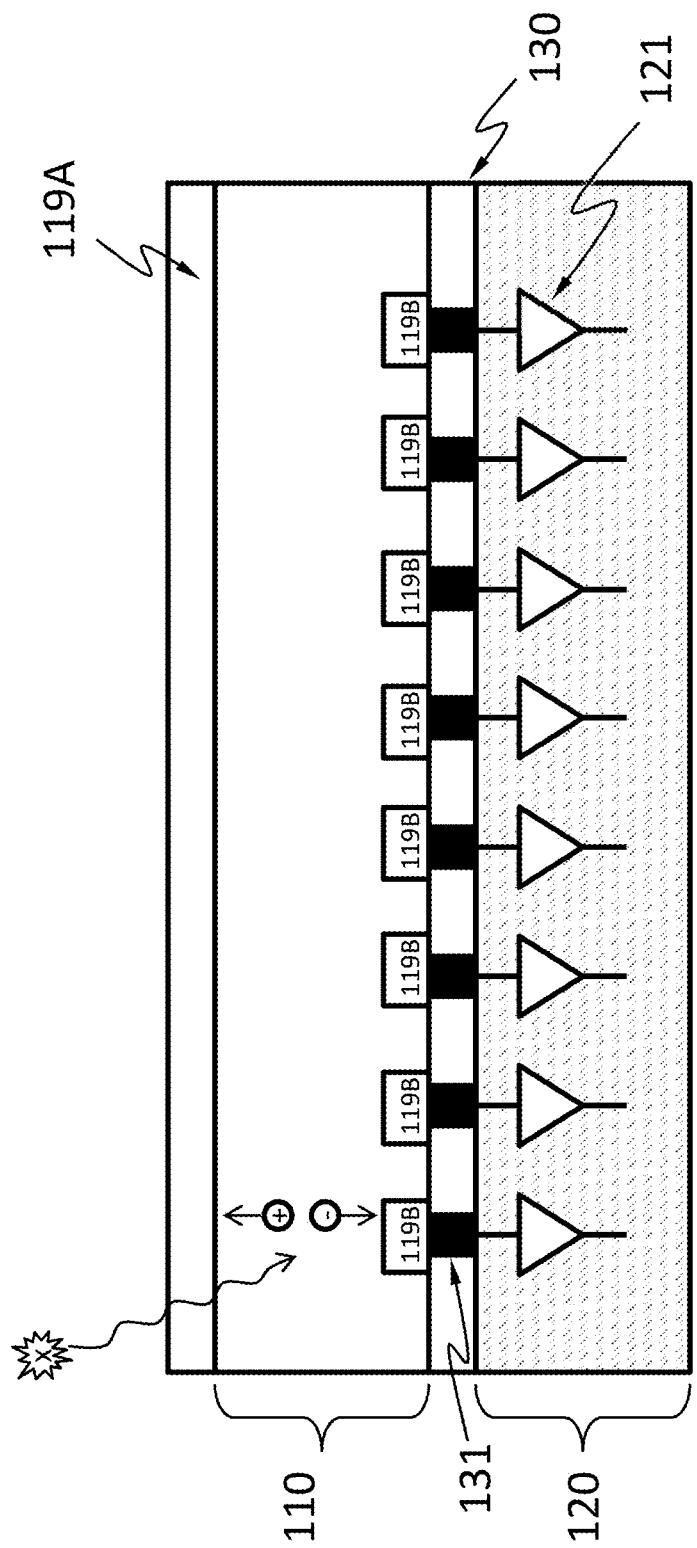
FIG. 1C schematically shows an alternative detailed cross-sectional view of the detector, according to an embodiment.

As shown in an alternative detailed cross-sectional view of the detector 100 in FIG. 1C, according to an embodiment, the X-ray absorption layer 110 may include a resistor of a semiconductor material such as, silicon, germanium, GaAs, CdTe, CdZnTe, or a combination thereof, but does not include a diode. The semiconductor may have a high mass attenuation coefficient for the X-ray energy of interest.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single X-ray photon are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by an X-ray photon incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by an X-ray photon incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias. The an electronic system 121 may be configured to count X-ray photons by the pixels or configured to measure the amounts of charge carriers accumulated at the pixels (e.g., by using an analog-to-digital converter (ADC) shared by the pixels).

Figure 2:
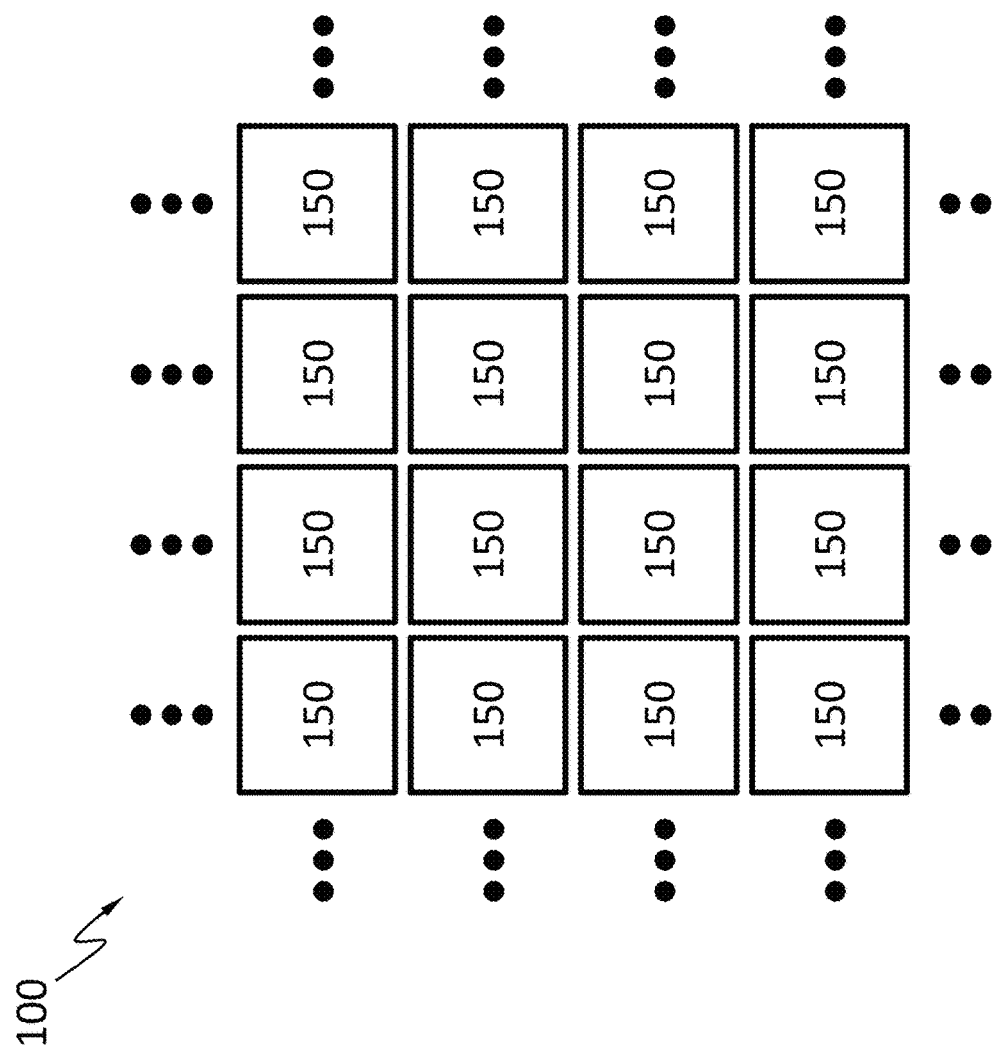
FIG. 2 schematically shows that the device may have an array of pixels, according to an embodiment.

FIG. 2 schematically shows that the detector 100 may have an array of pixels 150. The array may be a rectangular array, a honeycomb array, a hexagonal array or any other suitable array. Each pixel 150 may be configured to detect an X-ray photon incident thereon, measure the energy of the X-ray photon, or both. For example, each pixel 150 may be configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. The ADC may have a resolution of 10 bits or higher. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may be but do not have to be individually addressable.

Figure 3A:
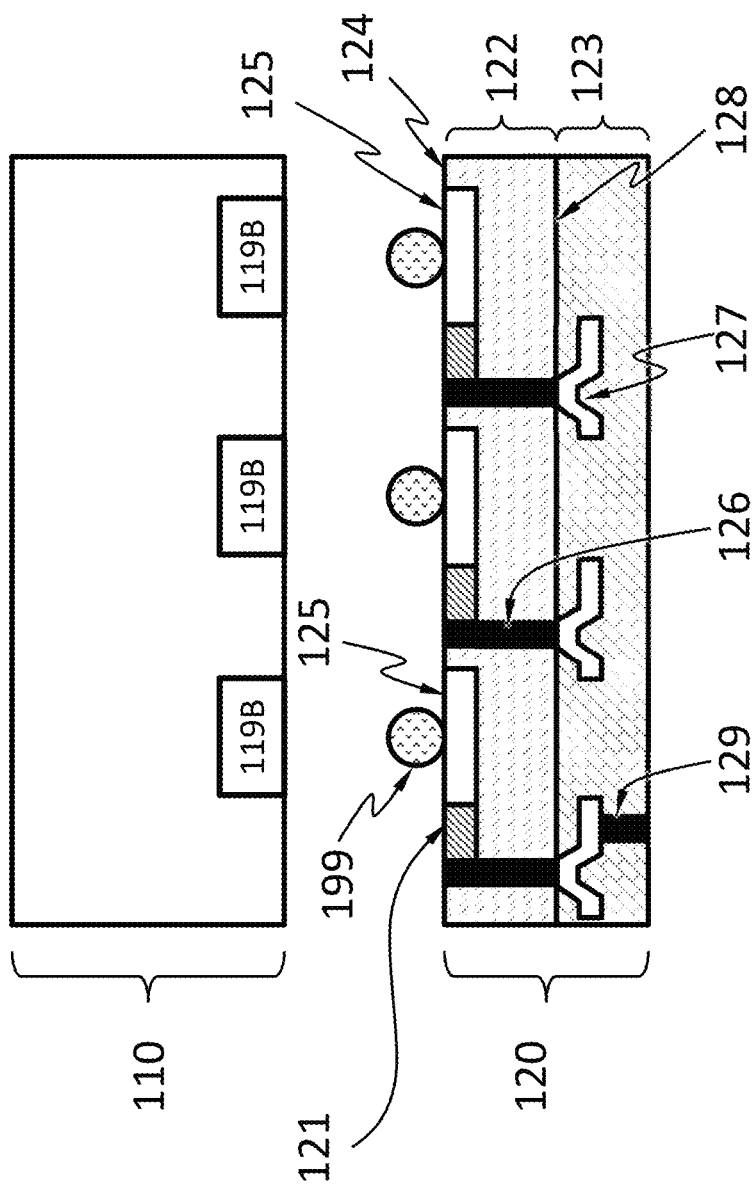
FIG. 3A schematically shows the electronics layer, according to an embodiment.

FIG. 3A schematically shows the electronics layer 120 according to an embodiment. The electronic layer 120 comprises a substrate 122 having a first surface 124 and a second surface 128. A "surface" as used herein is not necessarily exposed, but can be buried wholly or partially. The electronic layer 120 comprises one or more electric contacts 125 on the first surface 124. The one or more electric contacts 125 may be configured to be electrically connected to one or more electrical contacts 119B of the X-ray absorption layer 110. The electronics system 121 may be in or on the substrate 122. The electronic layer 120 comprises one or more vias 126 extending from the first surface 124 to the second surface 128. The electronic layer 120 may comprise a redistribution layer (RDL) 123 on the second surface 128. The RDL 123 may comprise one or more transmission lines 127. The electronics system 121 is electrically connected to the electric contacts 125 and the transmission lines 127 through the vias 126. The RDL 123 may include one or more vias 129 configured to electrically connect the transmission lines 127 to circuitry outside the electronics layer 120.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

The vias 126 pass through the substrate 122 and electrically connect electrical components (e.g., the electrical contacts 125) on the first surface 124 to electrical components (e.g., the RDL) on the second surface 128. The vias 126 are sometimes referred to as "through-silicon vias" although they may be fabricated in substrates of materials other than silicon.

The RDL 123 may comprise one or more transmission lines 127. The transmission lines 127 electrically connect electrical components (e.g., the vias 126) in the substrate 122 to bonding pads at other locations on the substrate 122. The transmission lines 127 may be electrically isolated from the substrate 122 except at certain vias 126 and certain bonding pads. The transmission lines 127 may be a material (e.g., Al) with small mass attenuation coefficient for the X-ray energy of interest. The RDL 123 may redistribute electrical connections to more convenient locations. The RDL 123 is especially useful when the detector 100 has a large number of pixels. If the detector 100 does not have a large number of pixels, the RDL 123 may be omitted and signals from the pixels may be routed on the first surface 124.

FIG. 3A further schematically shows bonding between the X-ray absorption layer 110 and the electronic layer 120 at the electrical contact 119B and the electrical contacts 125. The bonding may be by a suitable technique such as direct bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 199 deposited onto contact pads (e.g., the electrical contact 119B of the X-ray absorption layer 110 or the electrical contacts 125). Either the X-ray absorption layer 110 or the electronic layer 120 is flipped over and the electrical contact 119B of the X-ray absorption layer 110 are aligned to the electrical contacts 125. The solder bumps 199 may be melted to solder the electrical contact 119B and the electrical contacts 125 together. Any void space among the solder bumps 199 may be filled with an insulating material.

Figure 3B:
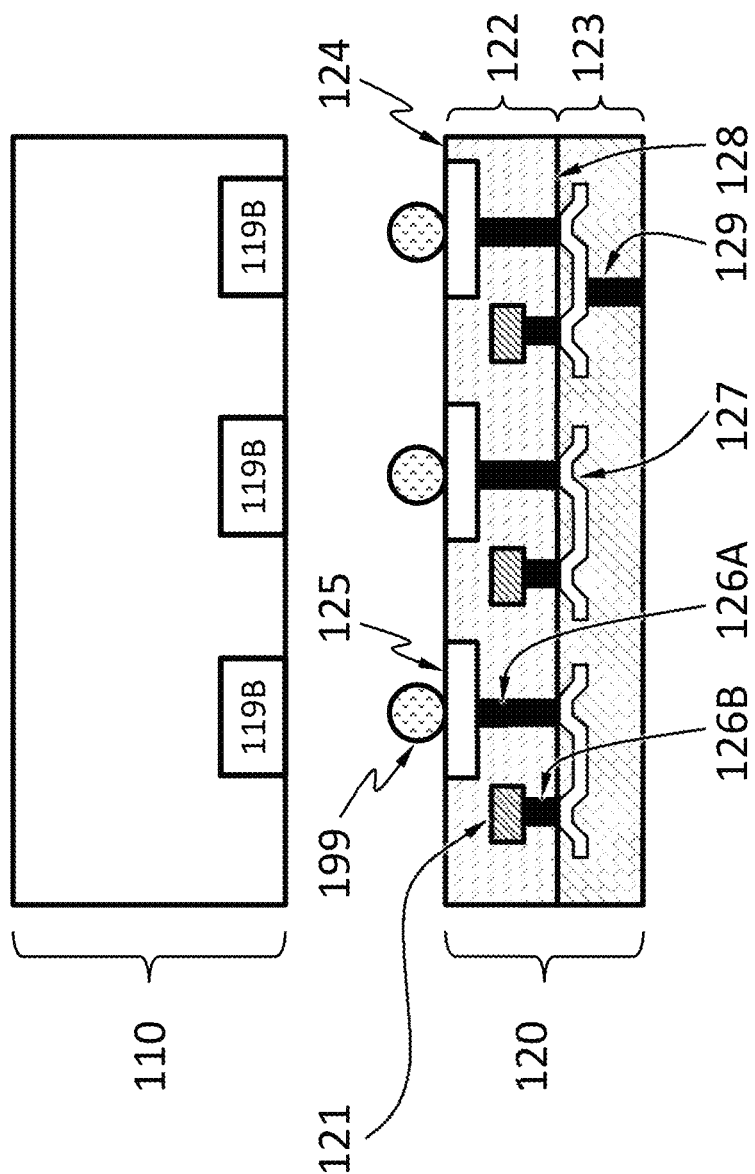
FIG. 3B schematically shows the electronics layer, according to an embodiment.

FIG. 3B schematically shows the electronics layer 120 according to an embodiment. The electronics layer 120 shown in FIG. 3B is different from the electronics layer 120 shown in FIG. 3A in the following ways. The electronics system 121 is buried in the substrate 122. The electronic layer 120 comprises one or more vias 126A extending from the first surface 124 to the second surface 128. The vias 126A electrically connect the electrical contacts 125 to the transmission lines 127 in the RDL 123 on the second surface 128. The electronic layer 120 further comprises one or more vias 126B extending from the second surface 128 to the electronics system 121. The vias 126B electrically connect the transmission lines 127 to the electronics system 121. The X-ray absorption layer 110 and the electronic layer 120 may also be bonded together (e.g., at the electrical contact 119B and the electrical contacts 125) by a suitable technique such as direct bonding or flip chip bonding.

Figure 3C:
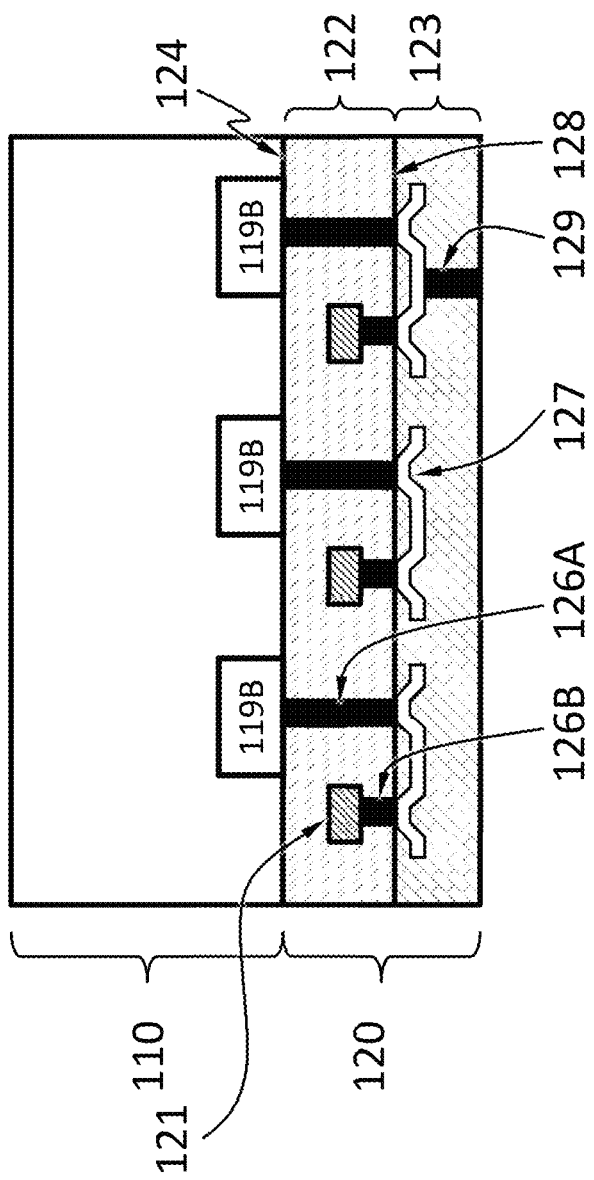
FIG. 3C schematically shows the electronics layer, according to an embodiment.

FIG. 3C schematically shows the electronics layer 120 according to an embodiment. The electronics layer 120 shown in FIG. 3C is different from the electronics layer 120 shown in FIG. 3A in the following ways. The electronics system 121 is buried in the substrate 122. The electronic layer 120 does not comprise one or more electric contacts 125 on the first surface 124. Instead, the substrate 122 including the buried electronics system 121 is bonded to the X-ray absorption layer 110 by direct bonding. Holes are formed in the substrate 123 and filled with metal to form the vias 126A that electrically route the electrical contact 119B to the second surface 128 and to form the vias 126B that electrically route the electronics system 121 to the second surface 128. The RDL 123 is then formed on the second surface 128 such that the transmission lines 127 electrically connect the vias 126A and 126B to complete the electrical connection from the electrical contact 119B to the electronics system 121. The X-ray absorption layer 110 may include multiple discrete chips. Each of the chips may be bonded to the electronic layer 120 individually or collectively. The X-ray absorption layer 110 including multiple discrete chips may help to accommodate the difference between the thermal expansion coefficients of the materials of the X-ray absorption layer 110 and the electronic layer 120.

The electronics layer 120 as shown in FIG. 3A, FIG. 3B or FIG. 3C are mere examples. The RDL (e.g., 123), the vias (e.g., 126, 126A, 126B, 129) and the transmission lines (e.g., 127) are not required for signal readout from the electronics system 121. The signal readout schemes illustrated in FIG. 4A, FIG. 4B and FIG. 4C may be implemented without using the RDL, the vias or the transmission lines.

Figure 4A:
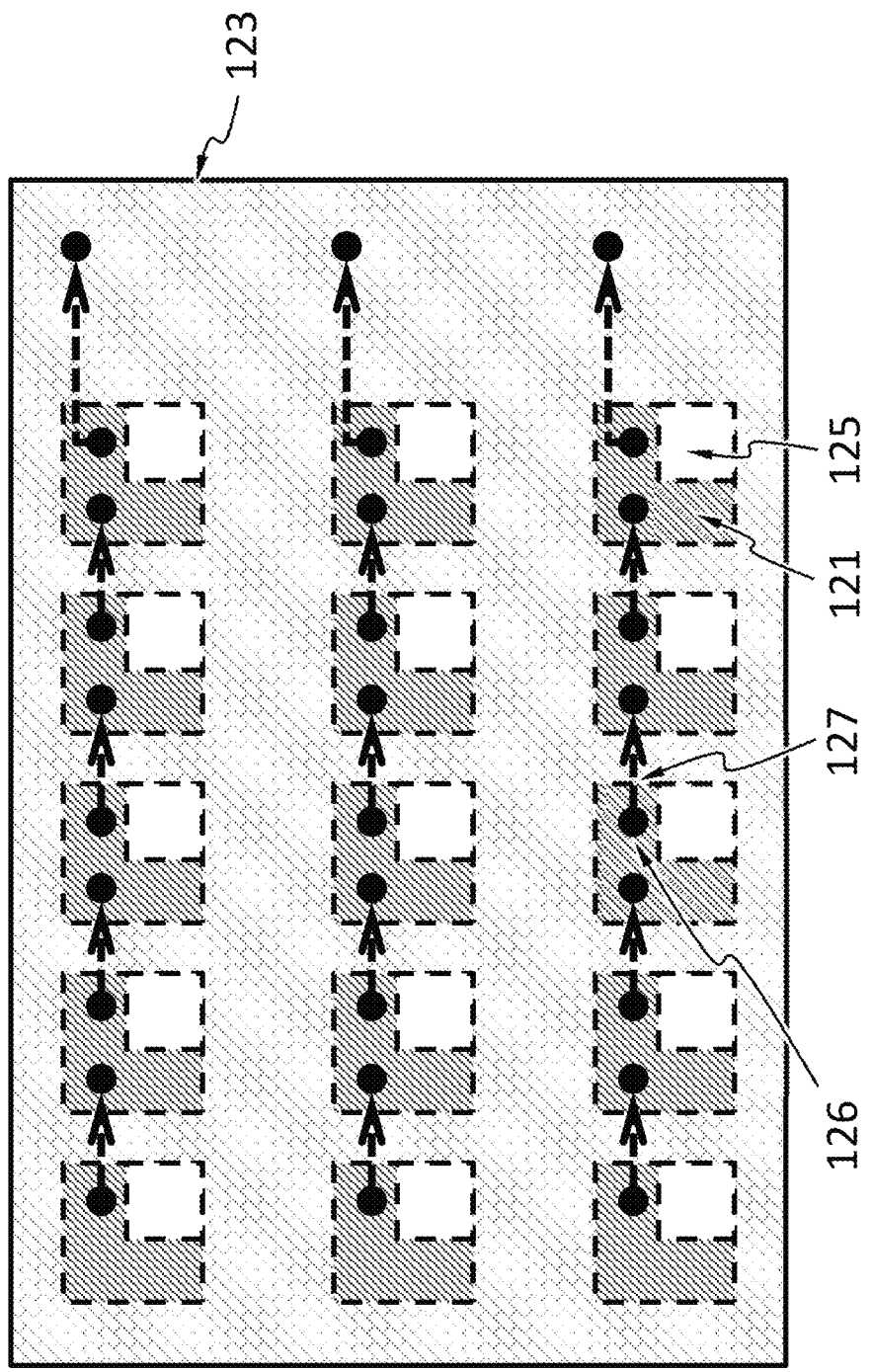
FIG. 4A, FIG. 4B and FIG. 4C each show an alternative top view of the RDL in FIG. 3A.
Figure 5A:
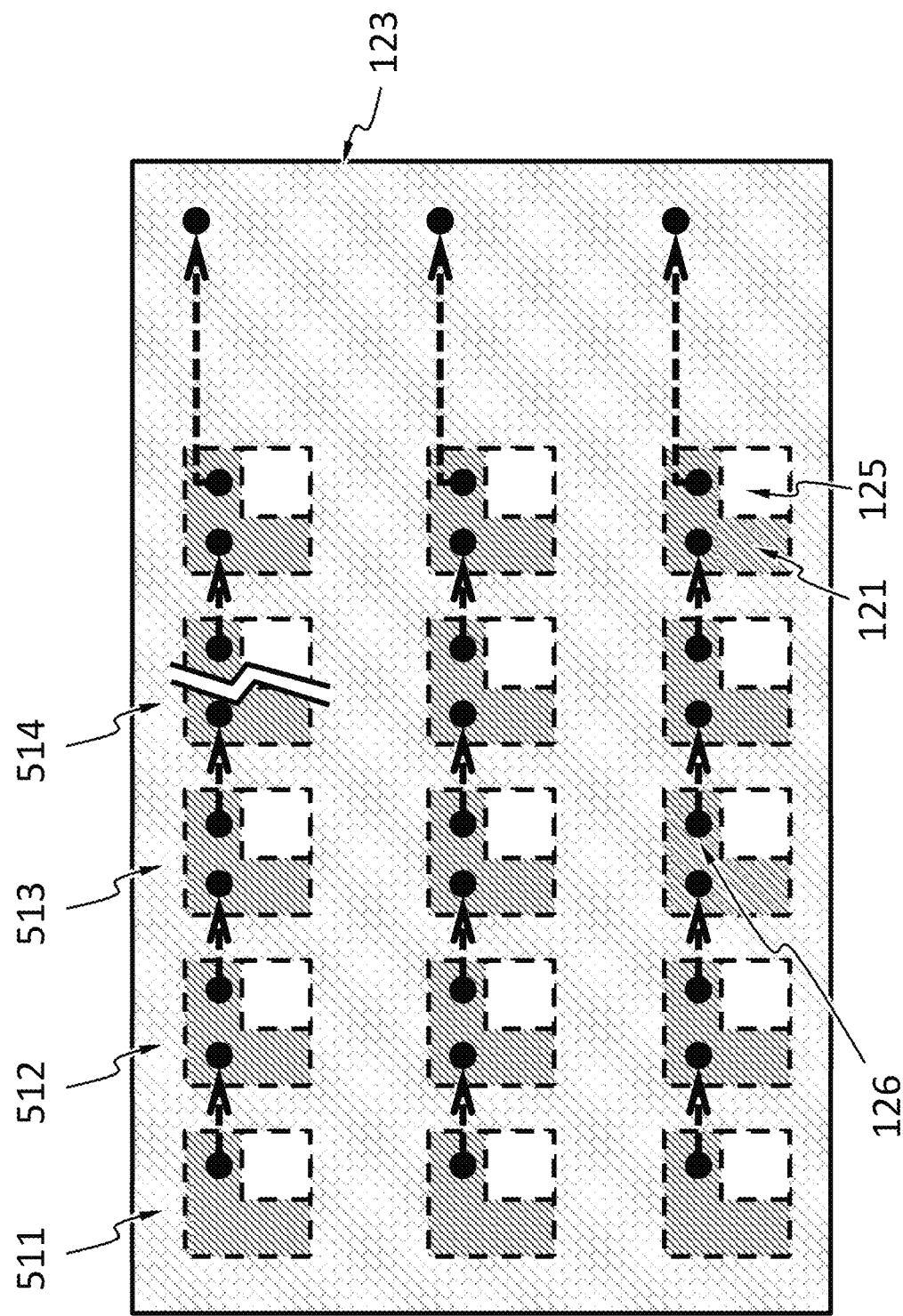

Signal from the detector 100 may be read out column by column. For example, signal from one pixel may be stored in a memory in the electronics system 121 associated with it; the signal may be successively shifted from one column to the next, and eventually to other processing circuitry. If the RDL 123 exists, FIG. 4A shows a top view of the RDL 123 in FIG. 3A to illustrate the positions of the vias 126 and the transmission lines 127, relative to the electric contacts 125 and the electronics system 121, according to an embodiment. The electric contacts 125, the electronics system 121 and the transmission lines 127 are shown in dotted lines because they are not directly visible in this view. As shown in FIG. 5A, if the electronics system 121 of one pixel 514 is defective (as marked by a breakline symbol), signal readout from all pixels (e.g., 511-513) upstream to the pixel 514 in the same column may fail. For example, if the memory in the electronics system 121 of the pixel 514 is defective, any signal shifted into the defective memory from the upstream pixels may be lost.

Figure 4B:
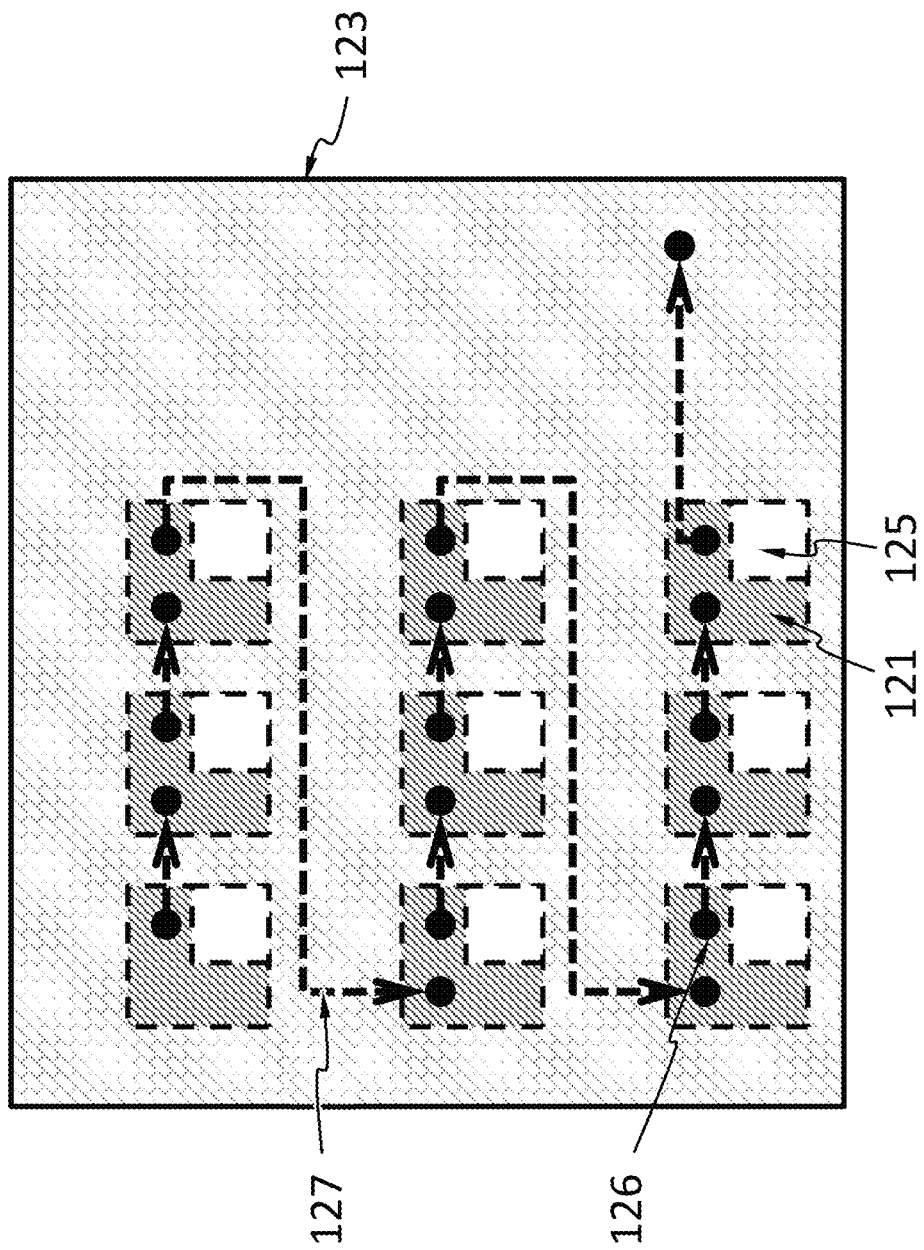

Signal from the detector 100 may be read out pixel by pixel. For example, signal from one pixel may be stored in a memory in the electronics system 121 associated with it; the signal may be successively shifted from the electronics system 121 associated with one pixel to the electronics system 121 associated with the next pixel, and eventually to other processing circuitry. If the RDL 123 exists, FIG. 4B shows a top view of the RDL 123 in FIG. 3A to illustrate the positions of the vias 126 and the transmission lines 127, relative to the electric contacts 125 and the electronics system 121, according to an embodiment. The electric contacts 125, the electronics system 121 and the transmission lines 127 are shown in dotted lines because they are not directly visible in this view. As shown in FIG. 5B, if the electronics system 121 of one pixel 524 is defective (as marked by a breakline symbol), signal readout from all pixels (e.g., 521-523) upstream to the pixel 524 may fail. For example, if the memory in the electronics system 121 of the pixel 524 is defective, any signal shifted into the defective memory from the upstream pixels may be lost.

Figure 4C:
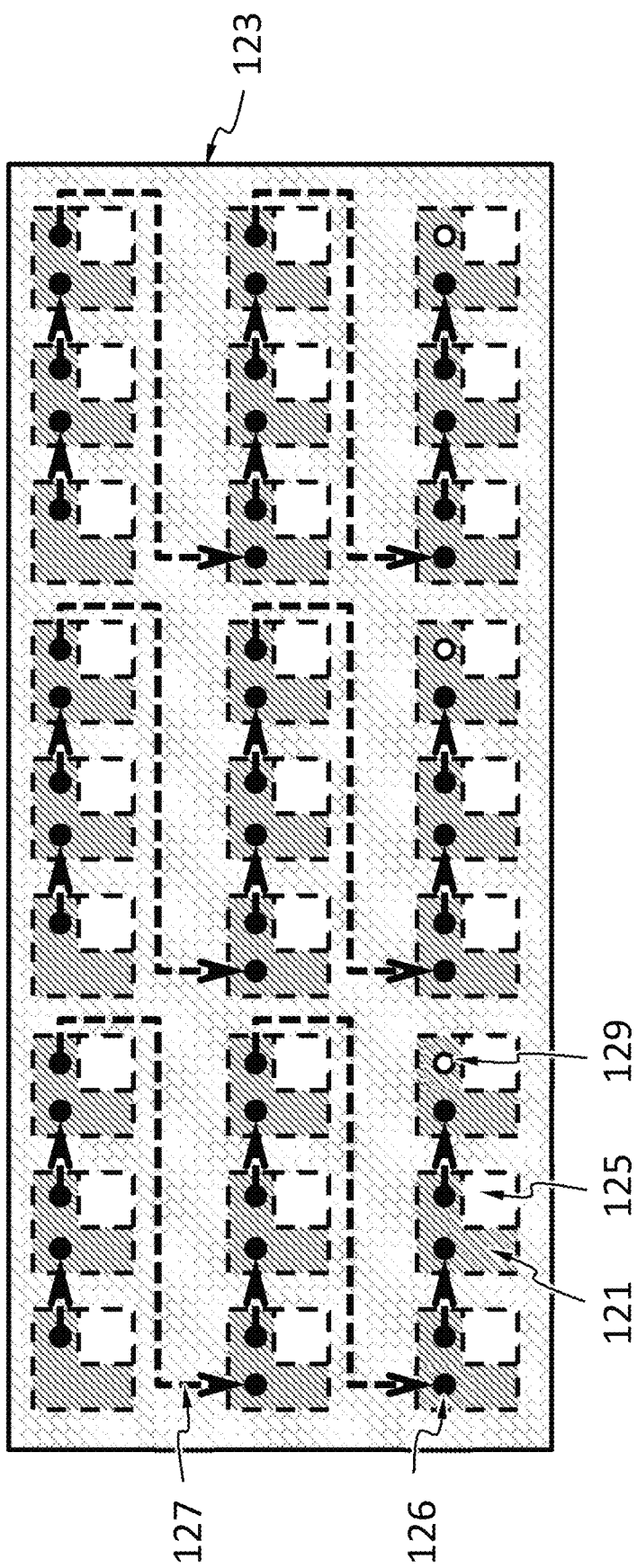
Figure 5C:
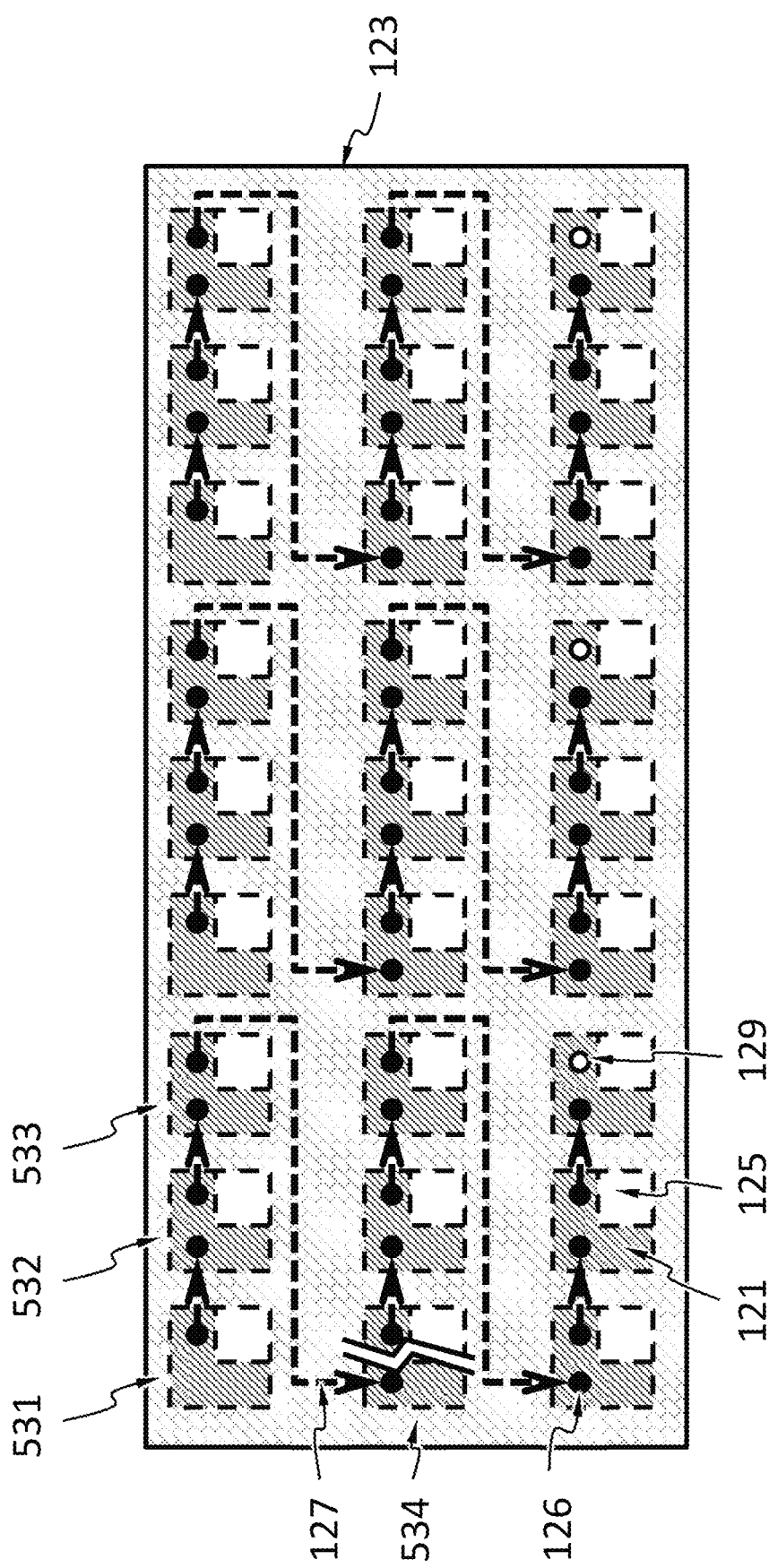

Signal from the detector 100 may be read out region by region. For example, signal from one pixel may be stored in a memory in the electronics system 121 associated with it; the signal may be successively shifted from the electronics system 121 associated with one pixel to the electronics system 121 associated with the next pixel with in the same region, and eventually to other processing circuitry. If the RDL 123 exists, FIG. 4C shows a top view of the RDL 123 in FIG. 3A to illustrate the positions of the vias 126 and the transmission lines 127, relative to the electric contacts 125 and the electronics system 121, according to an embodiment. The signal may be directed to the other processing circuitry through the vias 129 in the RDL 123. The electric contacts 125, the electronics system 121 and the transmission lines 127 are shown in dotted lines because they are not directly visible in this view. As shown in FIG. 5C, if the electronics system 121 of one pixel 534 is defective (as marked by a breakline symbol), signal readout from all pixels (e.g., 531-533) upstream to the pixel 534 in the same region may fail. For example, if the memory in the electronics system 121 of the pixel 534 is defective, any signal shifted into the defective memory from the upstream pixels may be lost.

Figure 6A:
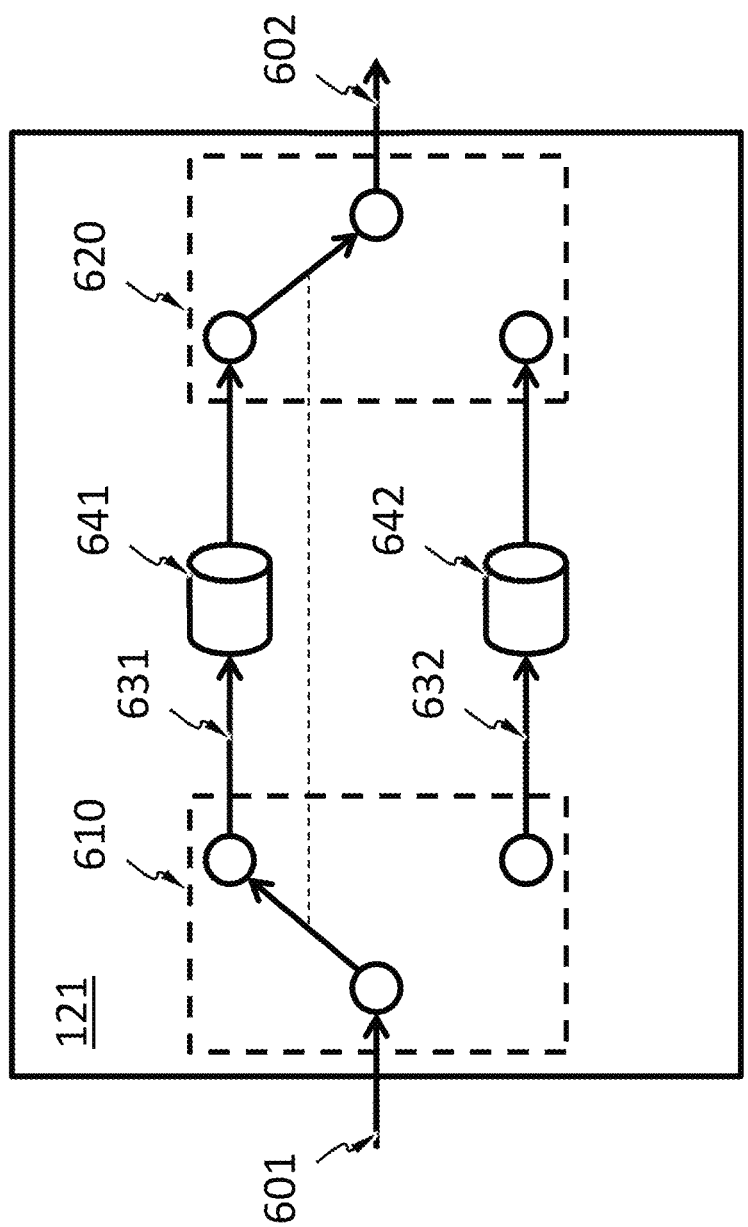
FIG. 6A shows a function block diagram of the electronic system, according to an embodiment.

The electronics system 121 may be configured to reduce the chance of or prevent losing signal from non-defective pixels upstream to a defective pixel. FIG. 6A shows a function block diagram of the electronic system 121, according to an embodiment. The electronics system 121 may have a redundancy in the memory of the electronics system 121. For example, the electronic system 121 may have multiple memories (e.g., 641 and 642). The memories may be configured to store signal from a pixel the electronics system 121 associates with or store signal shifted from an upstream pixel. The memories may be on separate and electrically parallel signal paths (e.g., 631 and 632) between an input terminal 601 and an output terminal 602 of the electronics system 121. The input terminal 601 is configured to receive signal into the electronics system 121, e.g., from the pixel the electronics system 121 associates with or an upstream pixel. The output terminal 602 is configured to transmit signal stored in the electronics system 121 to downstream circuitry such as a downstream pixel. The electronic system 121 may have a switch (e.g., two multi-pole multi-throw switches 610 and 620) that selects one of the multiple signal paths. For example, the signal path 631 may be selected by default and the memory 641 is used by default, unless the memory 641 is defective; if the memory 641 is defective, the signal path 632 may be selected and the memory 642 used as a result. With the redundancy in the memory of electronics system 121, even if one memory among the multiple memories is defective, the electronics system 121 still functions and signal from upstream pixels can still be shifted into and out of the electronics system 121.

Figure 6B:
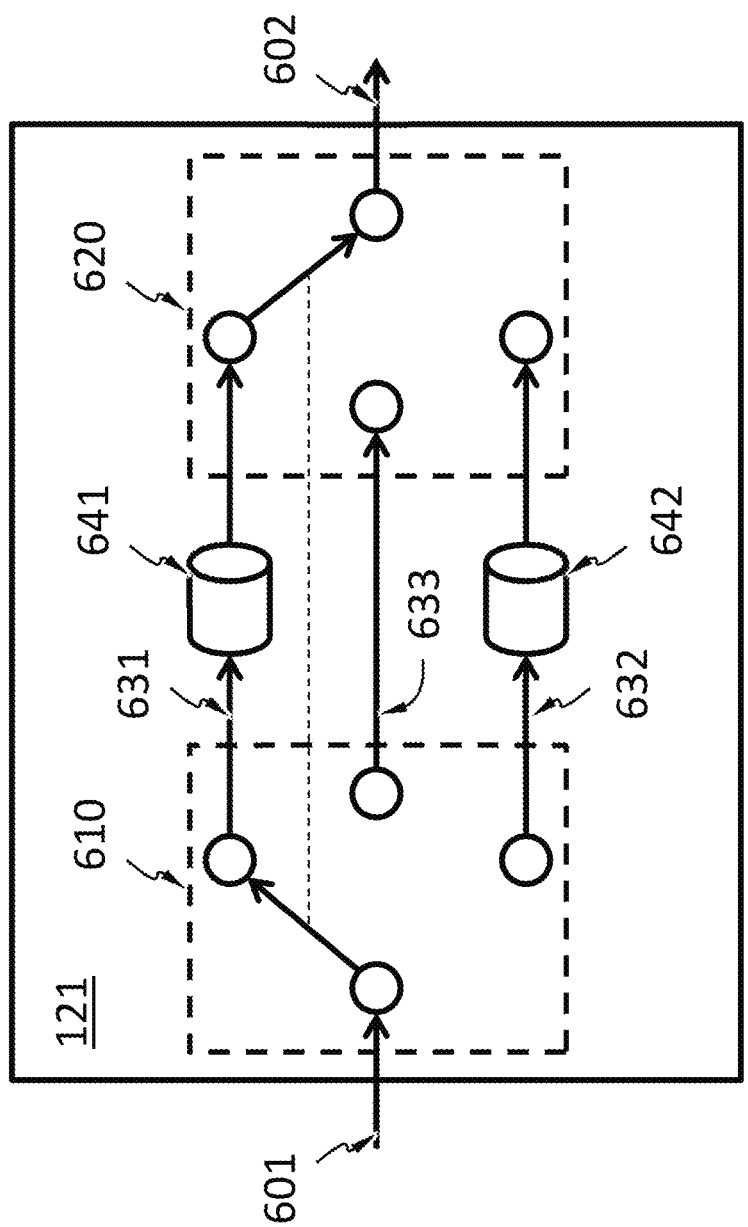
FIG. 6B shows a function block diagram of the electronic system, according to an embodiment.

FIG. 6B shows a function block diagram of the electronic system 121, according to an embodiment. In addition to the multiple memories (e.g., 641 and 642) and the multiple signal paths (e.g., 631 and 632) with memories thereon, the electronics system 121 may have a bypass path (e.g., 633) that connects the input terminal 601 and the output terminal 602, without a memory thereon. The bypass path may be selected by the multi-pole multi-throw switches 610 and 620 when all the memories are defective. When the bypass path is selected, signal from an upstream pixel to shift directly to a downstream pixel. When the bypass path is selected, signal from the pixel the electronics system 121 associates may not be read out.

Figure 6C:
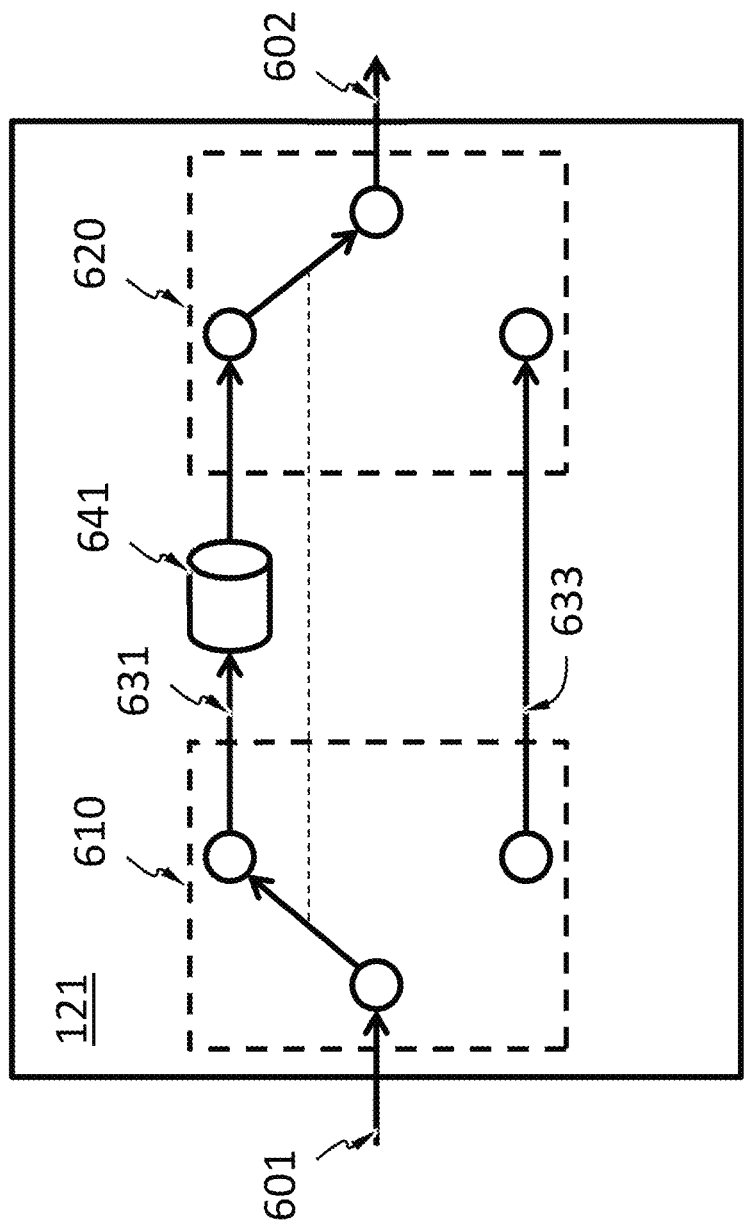
FIG. 6C shows a function block diagram of the electronic system, according to an embodiment.

FIG. 6C shows a function block diagram of the electronic system 121, according to an embodiment. The electronic system 121 may have only one memory 641 on the signal path 631, and a bypass path (e.g., 633) that connects the input terminal 601 and the output terminal 602, without a memory thereon. The bypass path may be selected by the multi-pole multi-throw switches 610 and 620 when all the memory is defective. When the bypass path is selected, signal from an upstream pixel to shift directly to a downstream pixel. When the bypass path is selected, signal from the pixel the electronics system 121 associates may not be read out.

Figure 6D:
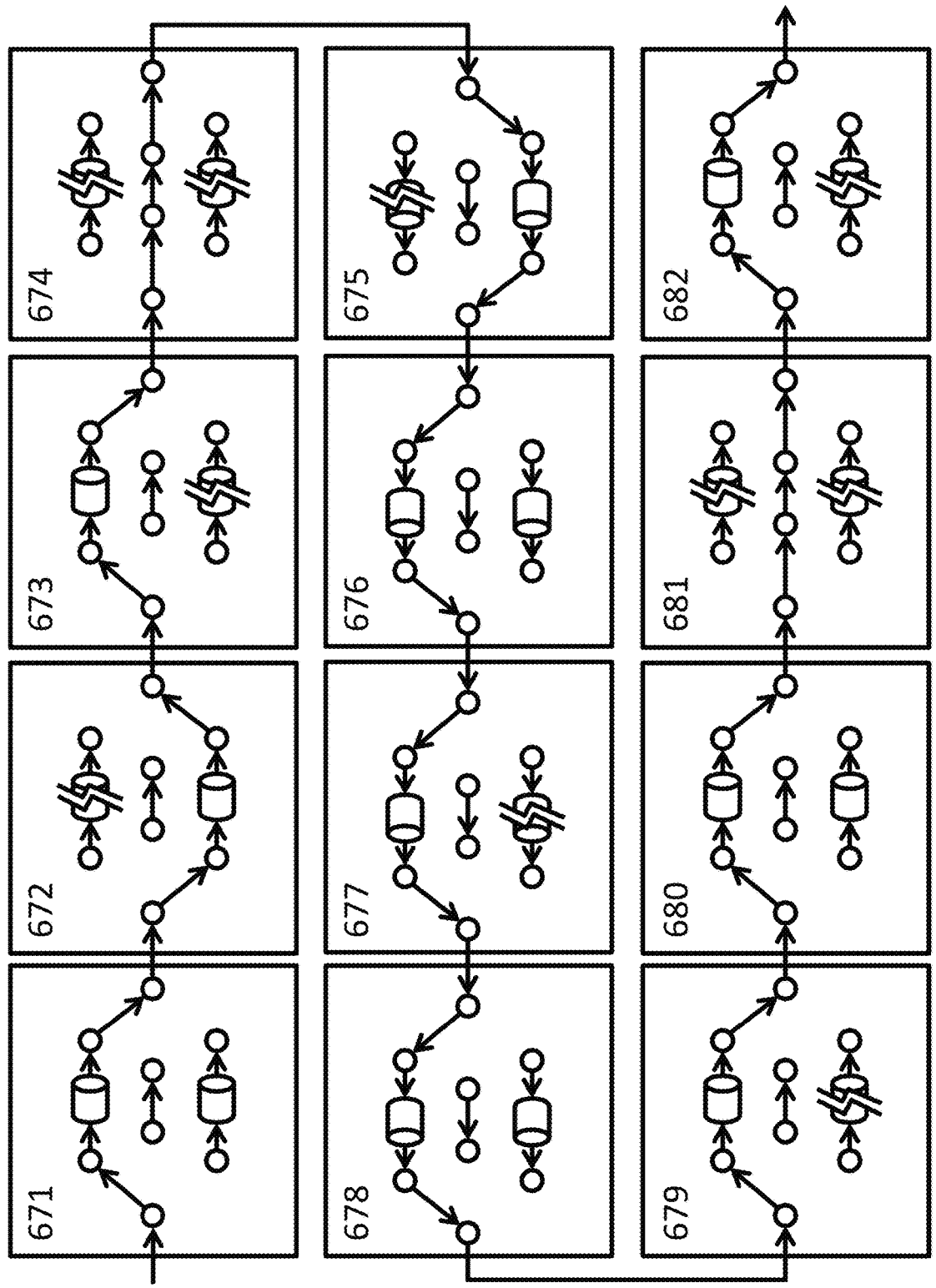
FIG. 6D schematically shows a chain of twelve electronics systems.

FIG. 6D schematically shows a chain of twelve electronics systems (671-682) according to the embodiment of FIG. 6B, each of the electronics systems associated with a pixel. Defective memories are marked with breakline symbols. In this example shown in FIG. 6D, despite that eight (672-675, 677, 679, 681 and 682) of the twelve electronics systems are defective, the chain is not broken (i.e., signal from pixels upstream to these twelve electronics systems 121 can still pass it). For example, in those electronics systems (672, 673, 675, 677, 679 and 682) with at least one defective memory, one of the non-defective memory is selected, for example by the multi-pole multi-throw switches, such that the non-defective memory can still store the signals from the pixels these electronics systems associate and allow signal from upstream pixels to be shifted into and out of these electronics systems. In those electronics systems (674 and 681) where all the memories are defective, the bypass signal pass is selected, for example by the multi-pole multi-throw switches, such that signal from an upstream pixel is shifted directly to a downstream pixel.

Figure 7:
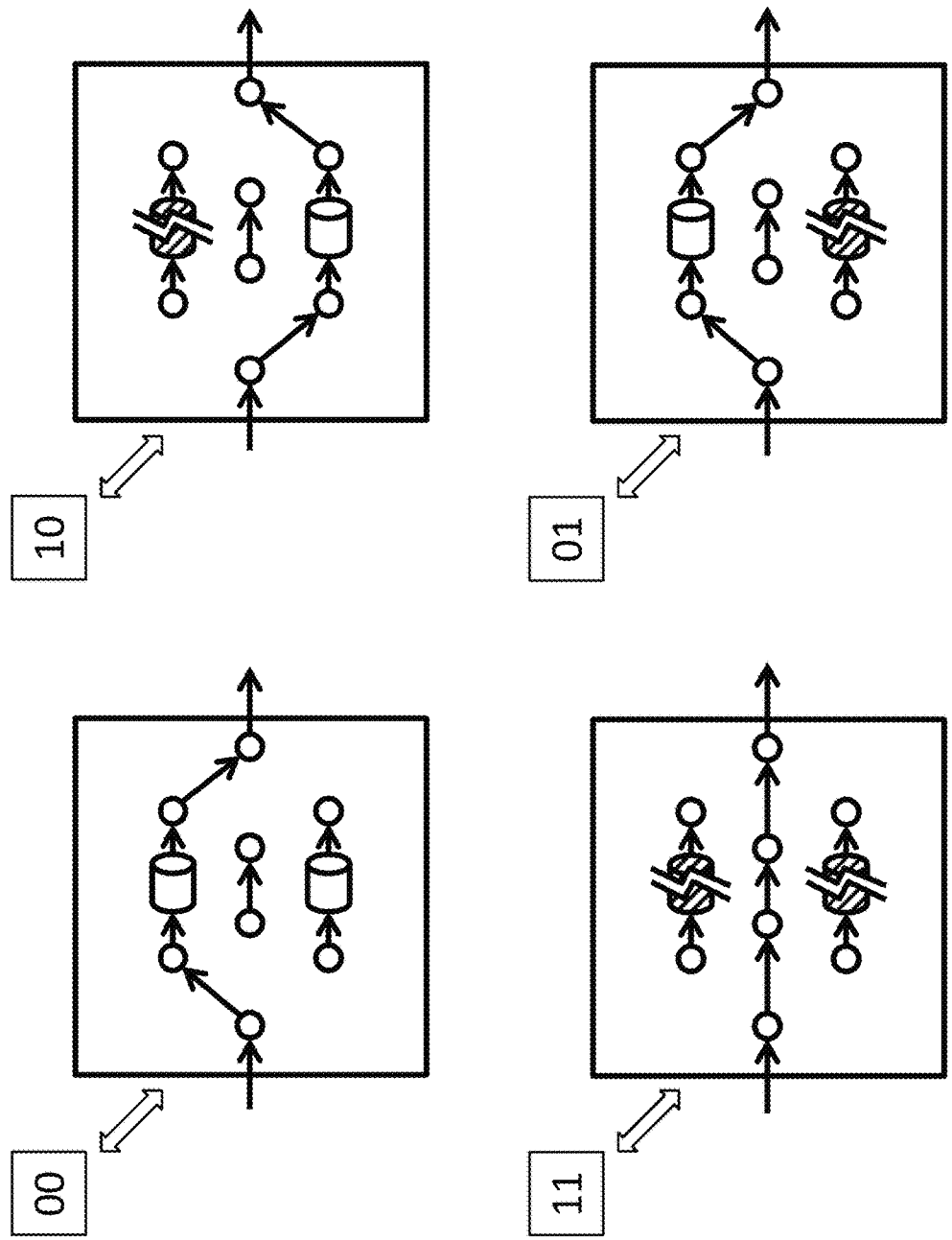
FIG. 7 schematically shows that the memories of an electronics system of FIG. 6B may have four different defectiveness states.

The defectiveness state and the selection of the signal path in the electronics system may be represented by a code. For example, as shown in FIG. 7, the memories of an electronics system of FIG. 6B may have four different defectiveness states: memory 641 defective and memory 642 defective, memory 641 defective but memory 642 not defective, memory 641 not defective but memory 642 defective, and memory 641 not defective and memory 642 not defective. In this example, these states are represented by codes "11," "10," "01," and "00." When the selection of the signal path can be determined from the defectiveness state, these codes can also represent the signal path selection. In this example, the codes "11," "10," "01," and "00" can respectively represent selection of the signal paths 633, 632, 631 and 631. These codes may be concatenated to represent the signal path of an entire chain of electronics systems. For example, the signal path of chain of FIG. 6D can be represented by the code "00 10 01 11 10 00 01 00 01 00 11 01."

Figure 8A:
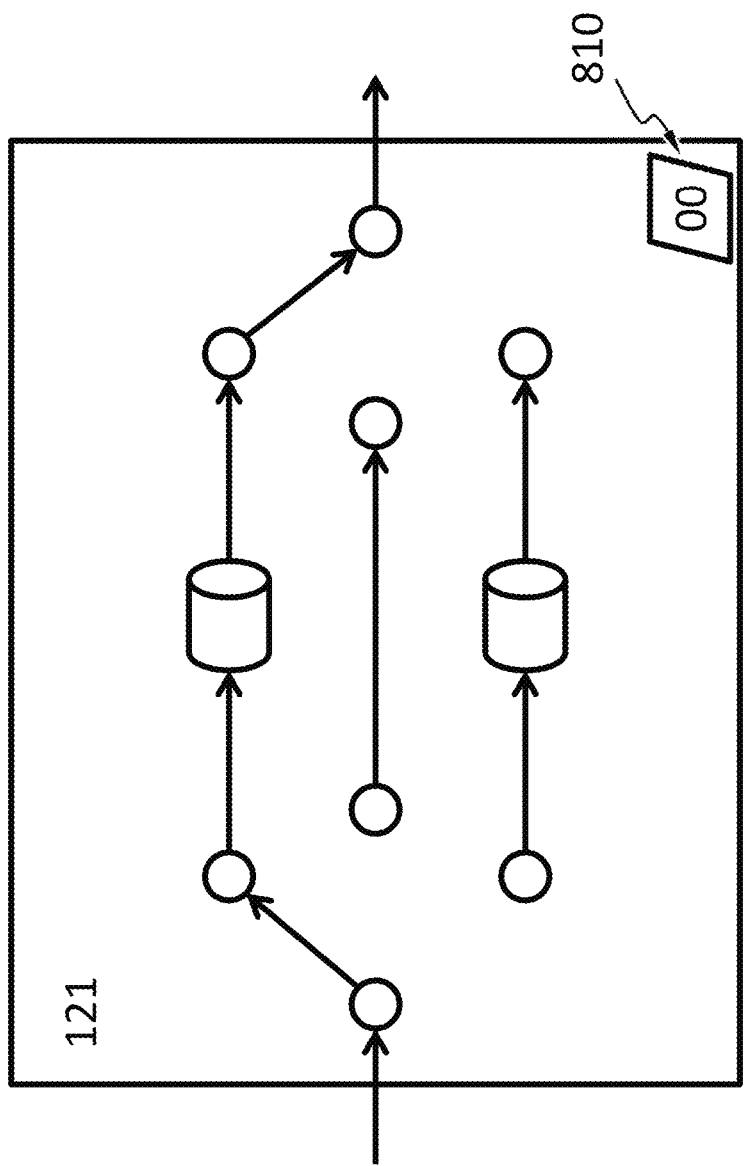
FIG. 8A schematically shows that the code representing the defectiveness state of the electronics system may be stored in the electronics system itself.

FIG. 8A schematically shows that the code representing the defectiveness state of the electronics system 121 (or the corresponding state of the switches) may be stored in the electronics system 121 itself. The electronics system 121 may include a memory 810 separate from the memories (e.g., 641 and 642 in FIG. 6A and FIG. 6B) for storing the signal. The memories 810 may be a non-volatile memory. In the example of FIGS. 6A and 6C, the memories 810 may have one bit or more. In the example of FIG. 6B, the memories 810 may have two bits or more.

Figure 8B:
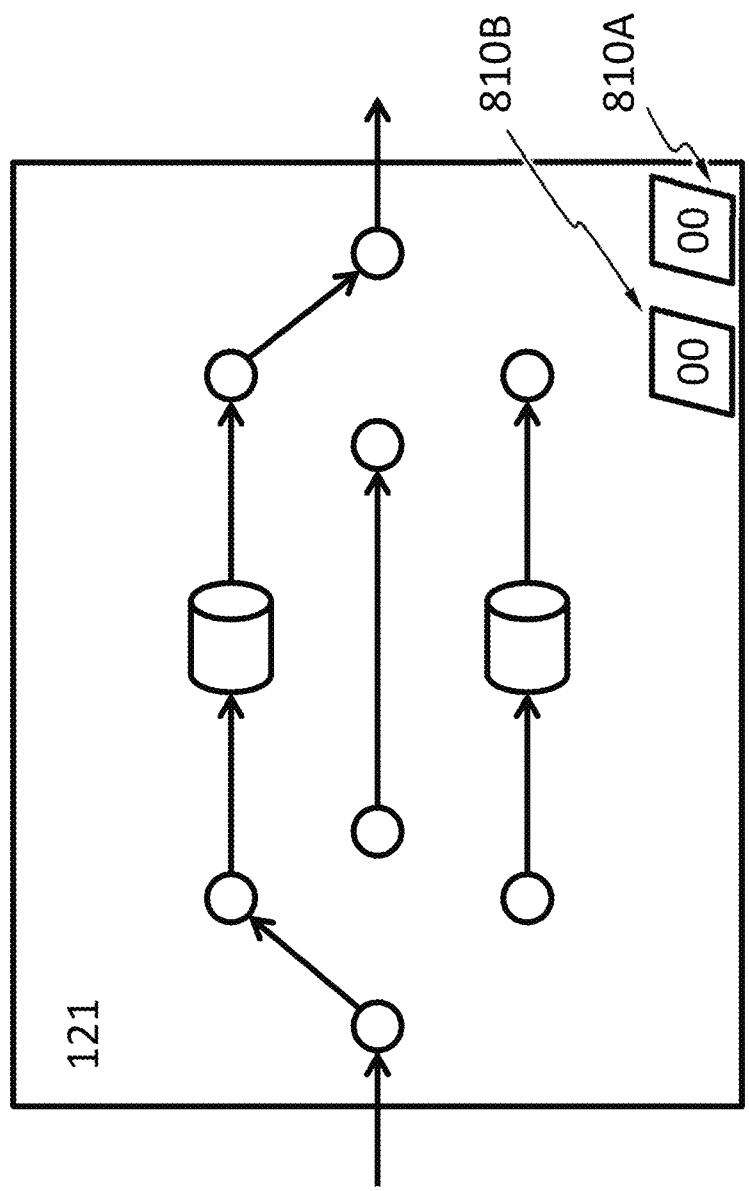
FIG. 8B schematically shows that the memory for storing the code representing the defectiveness state of the electronics system may have redundancy.

FIG. 8B schematically shows that the memory for storing the code representing the defectiveness state of the electronics system 121 (or the corresponding state of the switches) may have redundancy, to guard against any failure in this memory for storing the code. For example, there may be two memories 810A and 810B for storing this code. There may be an additional memory for storing the selection between the redundant memories 810A and 810B.

Figure 9A:
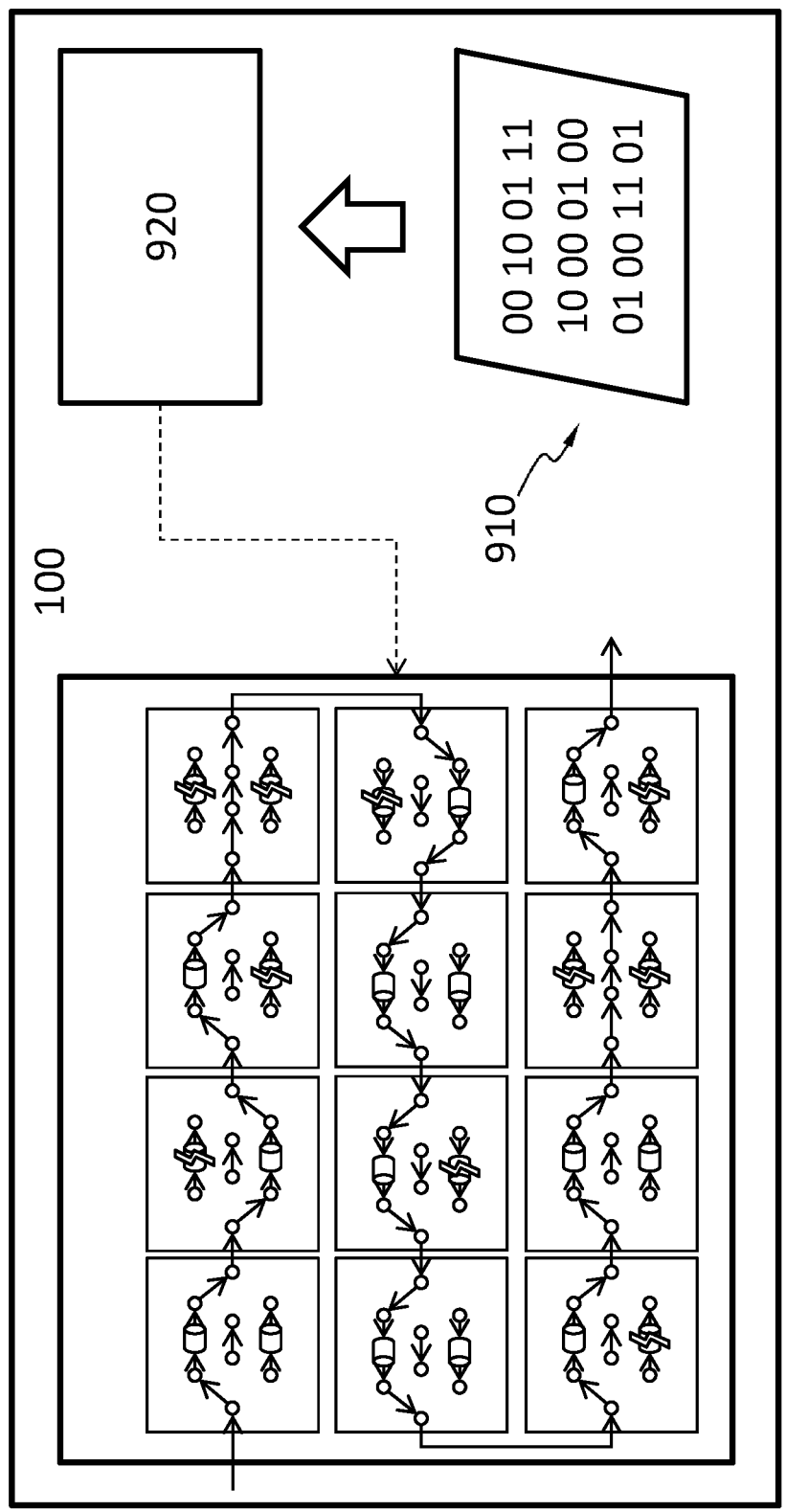
FIG. 9A schematically shows that the code representing the signal path of a chain of electronics system may be stored in a memory of the detector.

FIG. 9A schematically shows that the code representing the signal path of a chain of electronics system 121 may be stored in a memory of the detector 100. The memories 910 may be a non-volatile memory. A controller 920 of the detector 100 may be configured to select the signal path of the chain based on the code stored in the memory 910. The code representing the signal path of the chain of electronics system 121 may be used as a key to the detector 100, e.g., for controlling access to the detector 100, determining the times of use, or billing.

Figure 9B:
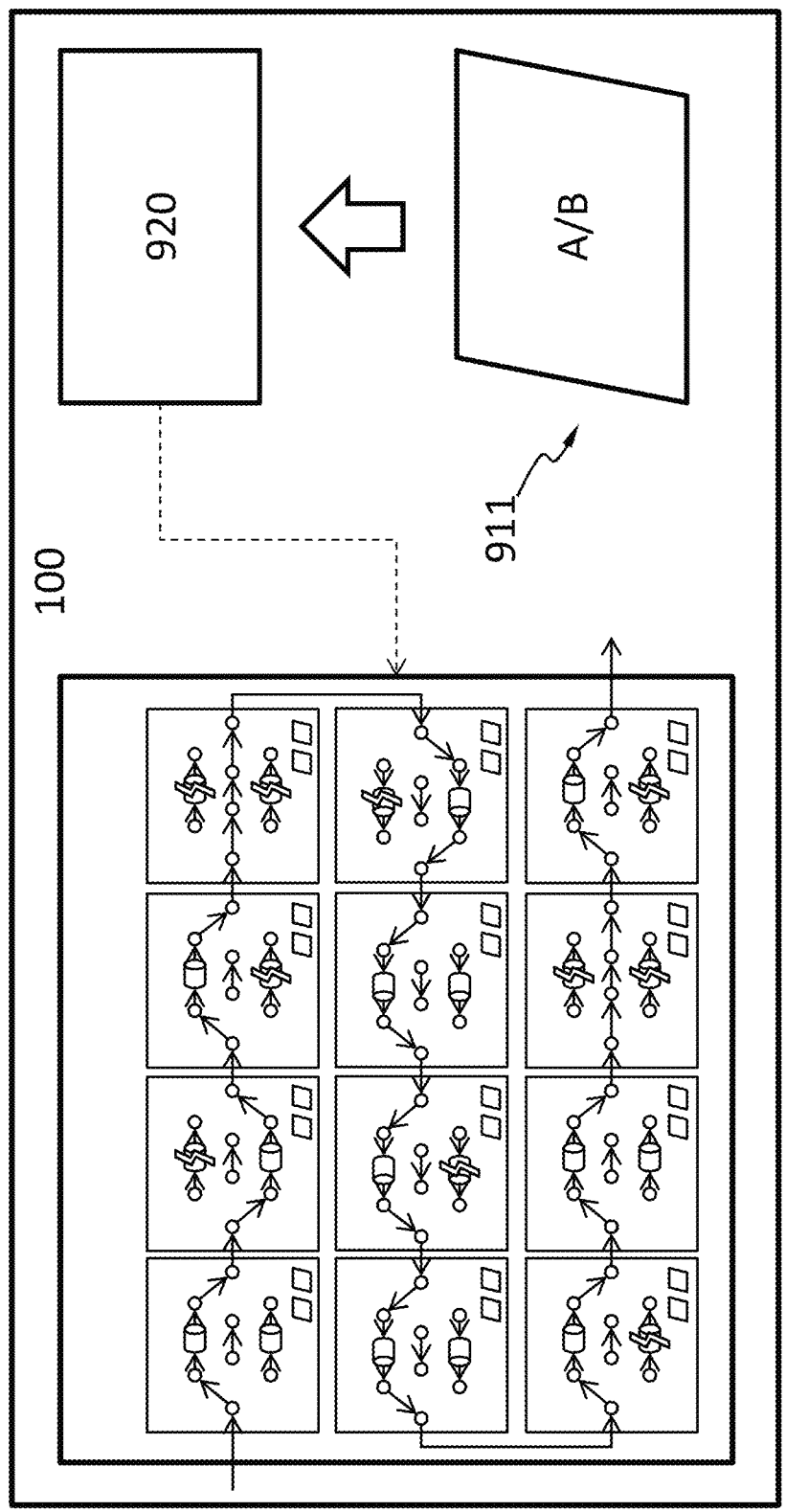
FIG. 9B schematically shows that the selection between the redundant memories for storing the codes representing the defectiveness states in a group of electronics systems may be switched collectively.

FIG. 9B schematically shows that the selection between the redundant memories for storing the codes representing the defectiveness states (or the corresponding states of the switches) in a group of electronics systems 121 may be switched collectively. The selection may be stored in another memory 911. For example, the codes stored in every memory 810A (see FIG. 8B) of the group of electronics systems 121 may be used to represent the defectiveness states, or the codes stored in every memory 810B (see FIG. 8B) of the group of electronics systems 121 may be used to represent the defectiveness states. For example, for each group of electronics systems 121 that are switched collectively, one code representing the selection between the redundant memories may be stored in the memory 911. For example, for a set of groups having selections of 810A, 810A, 810B, 810A, 810A, 810A, 810B, 810B . . . , the codes representing these selections stored in the memory 911 may be 00100011 . . . ("0" representing 810A is selected and "1" representing 810B is selected). A controller 920 of the detector 100 may be configured to select among the redundant memories (e.g., 810A and 810B) based on the code stored in the memory 911. The code stored in the memory 911 may be used as a key to the detector 100, e.g., for controlling access to the detector 100, determining the times of use, or billing.

Figure 10:
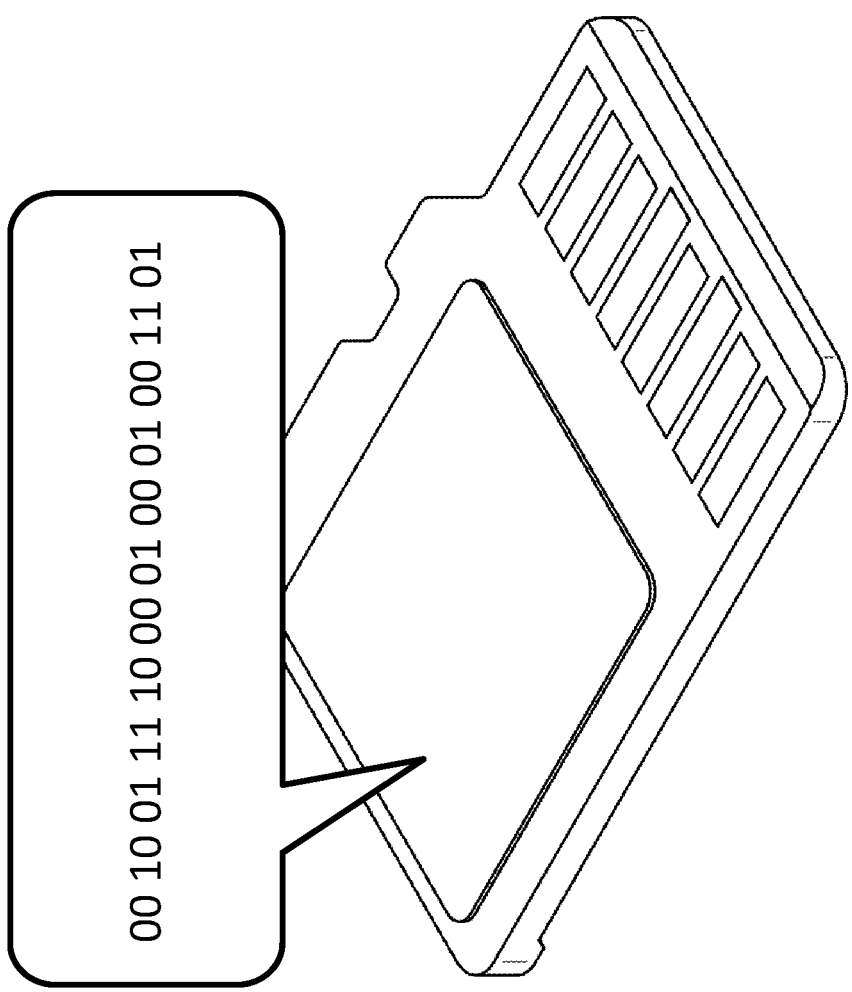
FIG. 10 schematically shows that the code representing the signal path of the chain of electronics system may be stored in a dongle.

FIG. 10 schematically shows that the code representing the signal path of the chain of electronics system 121 may be stored in a removable dongle, which can be in a form of a memory card or memory stick. Physical presence of the dongle may be required before the detector 100 may be used. Other functions can be integrated into the dongle. For example, the dongle can serve as a license that requires periodic renewal; the dongle may have an amount of money recorded thereon to charge a fee for each use of the detector 100.

Figure 11:
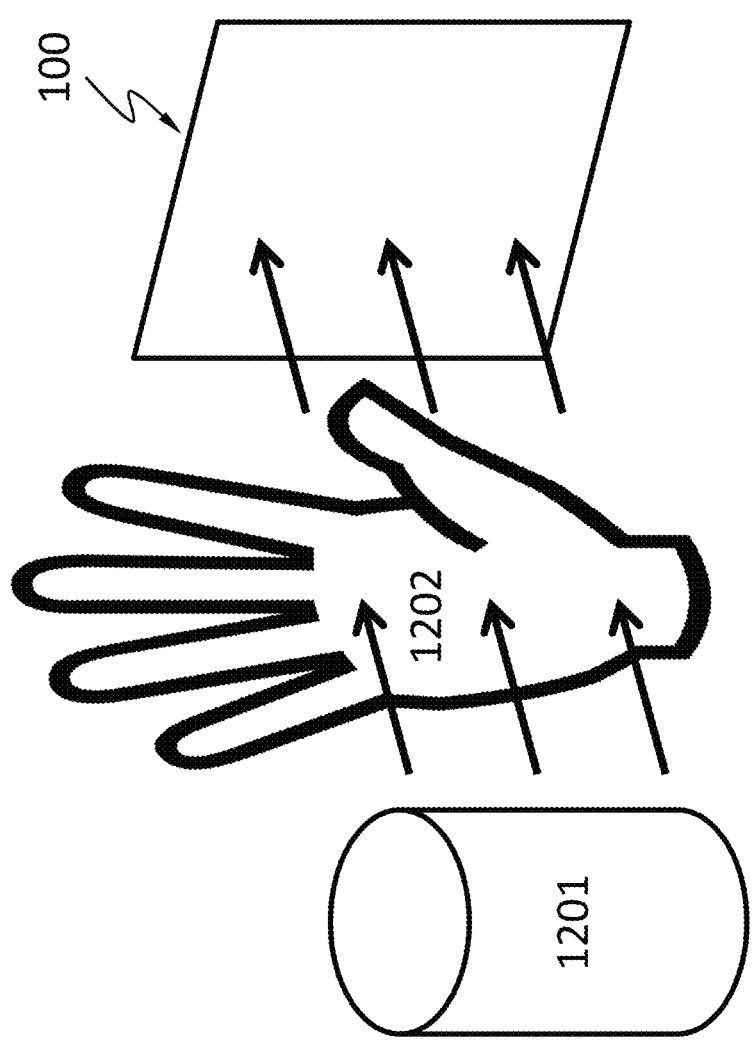
FIG. 11 schematically shows a system comprising the semiconductor X-ray detector described herein, suitable for medical imaging such as chest X-ray radiography, abdominal X-ray radiography, etc., according to an embodiment.

FIG. 11 schematically shows a system comprising the detector 100 described herein. The system may be used for medical imaging such as chest X-ray radiography, abdominal X-ray radiography, etc. The system comprises an X-ray source 1201. X-ray emitted from the X-ray source 1201 penetrates an object 1202 (e.g., a human body part such as chest, limb, abdomen), is attenuated by different degrees by the internal structures of the object 1202 (e.g., bones, muscle, fat and organs, etc.), and is projected to the detector 100. The semiconductor X-ray detector 100 forms an image by detecting the intensity distribution of the X-ray.

Figure 12:
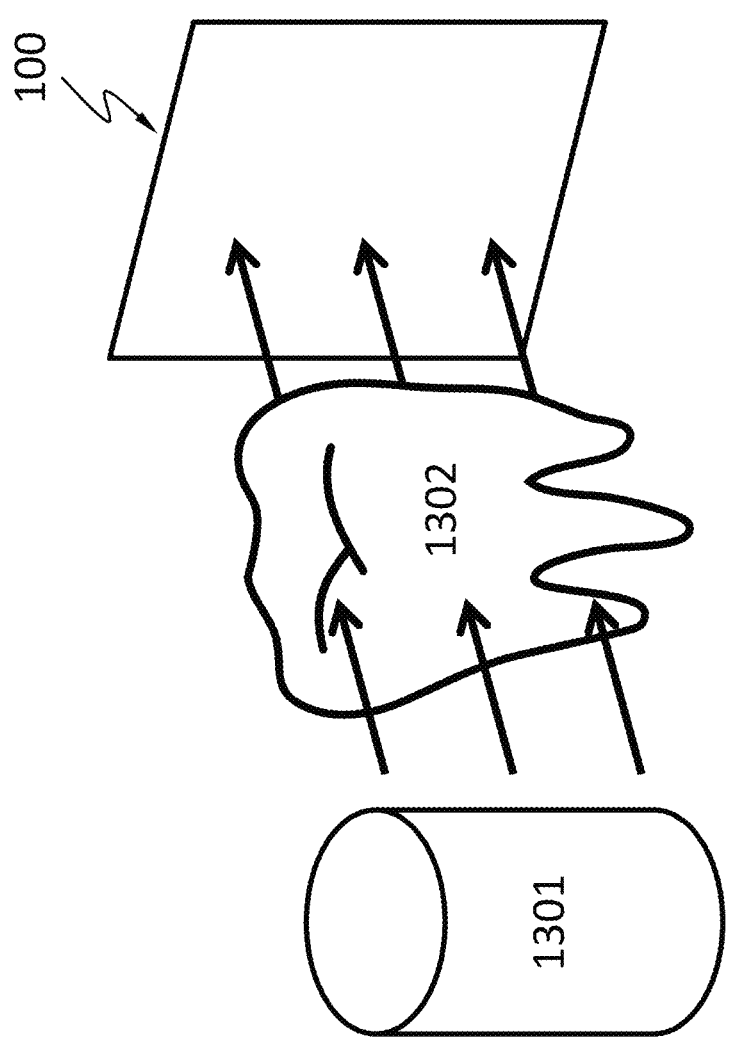
FIG. 12 schematically shows a system comprising the semiconductor X-ray detector described herein suitable for dental X-ray radiography, according to an embodiment.

FIG. 12 schematically shows a system comprising the detector 100 described herein. The system may be used for medical imaging such as dental X-ray radiography. The system comprises an X-ray source 1301. X-ray emitted from the X-ray source 1301 penetrates an object 1302 that is part of a mammal (e.g., human) mouth. The object 1302 may include a maxilla bone, a palate bone, a tooth, the mandible, or the tongue. The X-ray is attenuated by different degrees by the different structures of the object 1302 and is projected to the detector 100. The detector 100 forms an image by detecting the intensity distribution of the X-ray. Teeth absorb X-ray more than dental caries, infections, periodontal ligament. The dosage of X-ray radiation received by a dental patient is typically small (around 0.150 mSv for a full mouth series).

Figure 13:
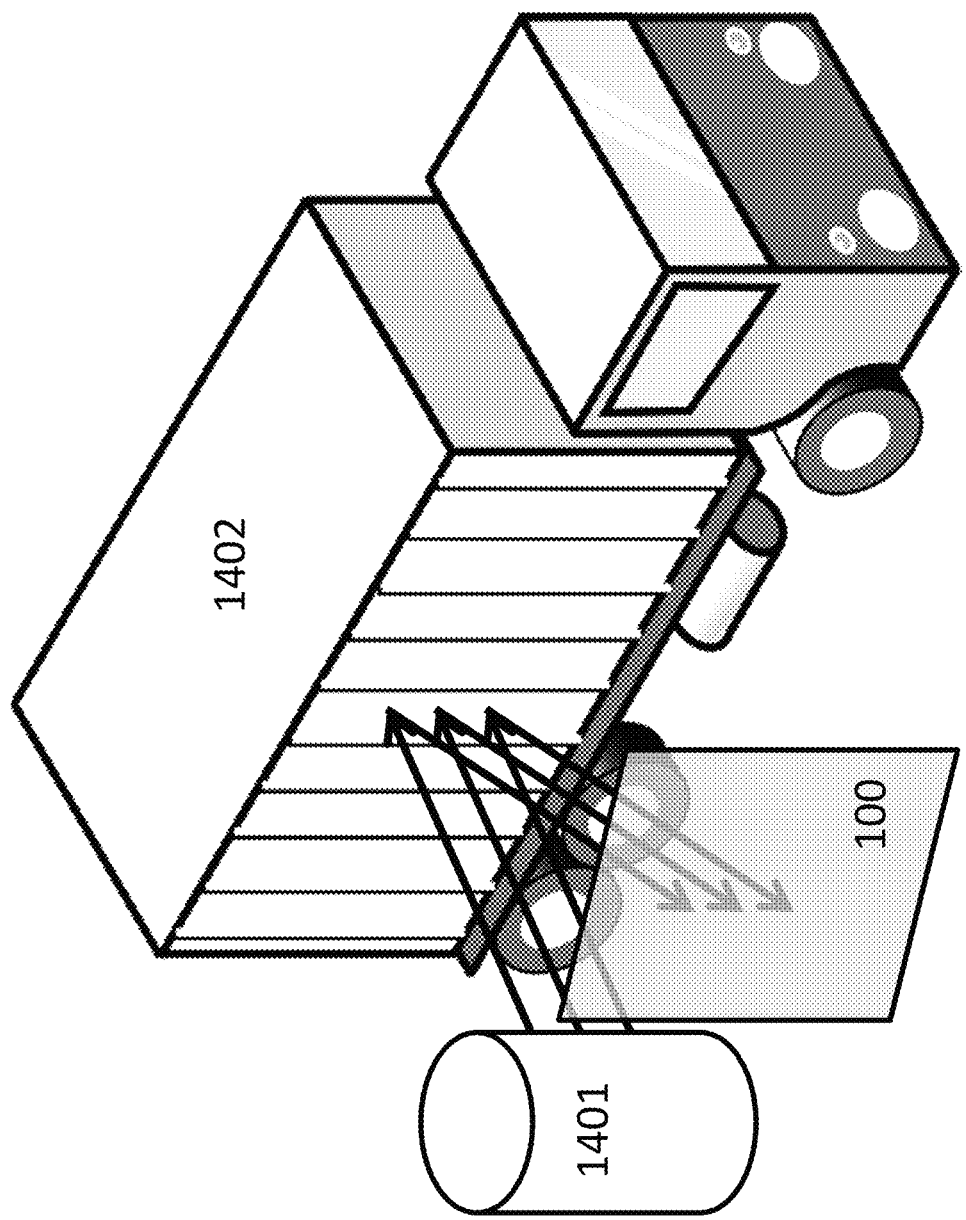
FIG. 13 schematically shows a cargo scanning or non-intrusive inspection (NII) system comprising the semiconductor X-ray detector described herein, according to an embodiment.

FIG. 13 schematically shows a cargo scanning or non-intrusive inspection (NII) system comprising the detector 100 described herein. The system may be used for inspecting and identifying goods in transportation systems such as shipping containers, vehicles, ships, luggage, etc. The system comprises an X-ray source 1401. X-ray emitted from the X-ray source 1401 may backscatter from an object 1402 (e.g., shipping containers, vehicles, ships, etc.) and be projected to the detector 100. Different internal structures of the object 1402 may backscatter X-ray differently. The semiconductor X-ray detector 100 forms an image by detecting the intensity distribution of the backscattered X-ray and/or energies of the backscattered X-ray photons.

Figure 14:
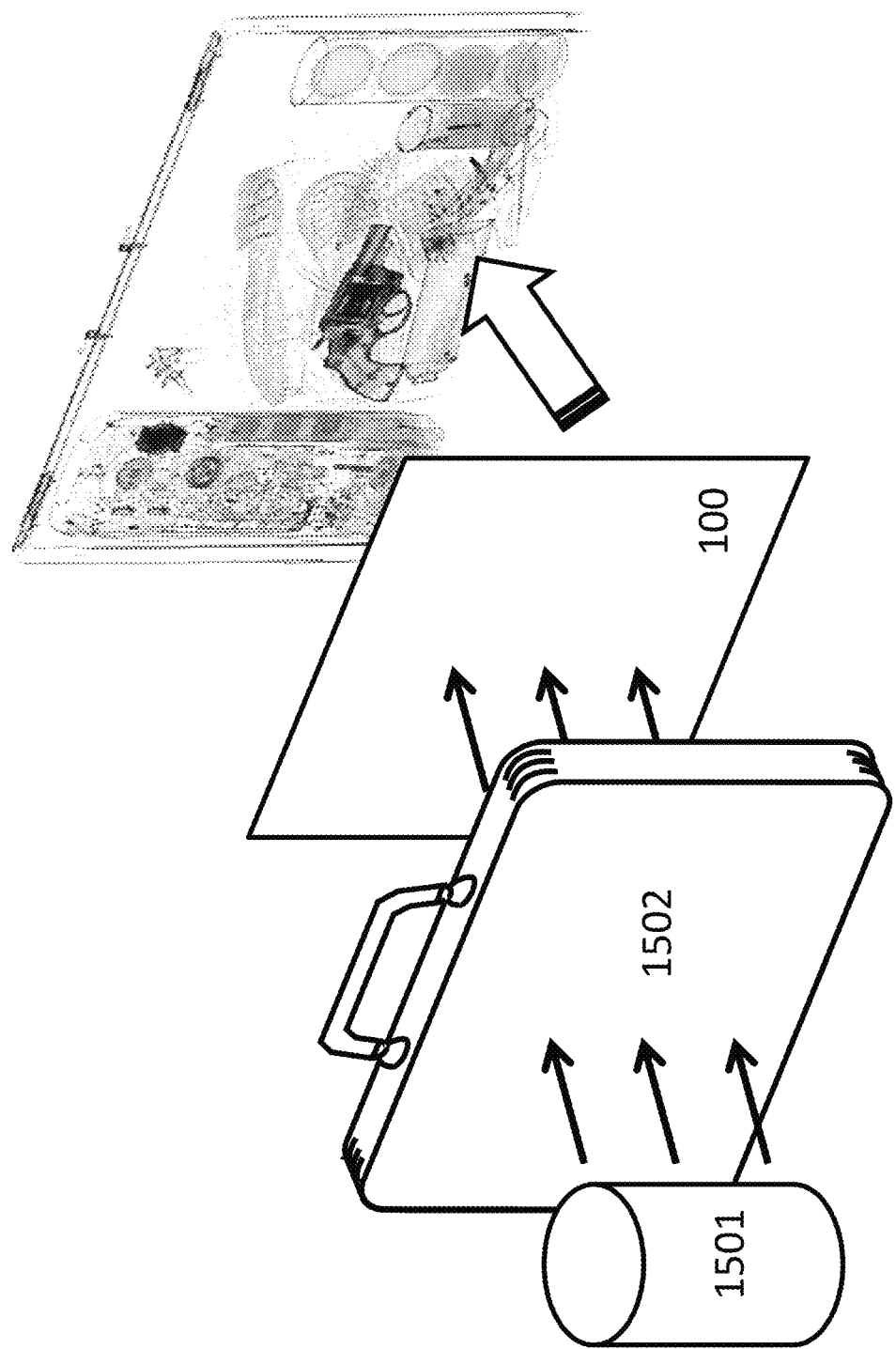
FIG. 14 schematically shows another cargo scanning or non-intrusive inspection (NII) system comprising the semiconductor X-ray detector described herein, according to an embodiment.

FIG. 14 schematically shows another cargo scanning or non-intrusive inspection (NII) system comprising the detector 100 described herein. The system may be used for luggage screening at public transportation stations and airports. The system comprises an X-ray source 1501. X-ray emitted from the X-ray source 1501 may penetrate a piece of luggage 1502, be differently attenuated by the contents of the luggage, and projected to the semiconductor X-ray detector 100. The detector 100 forms an image by detecting the intensity distribution of the transmitted X-ray. The system may reveal contents of luggage and identify items forbidden on public transportation, such as firearms, narcotics, edged weapons, flammables.

Figure 15:
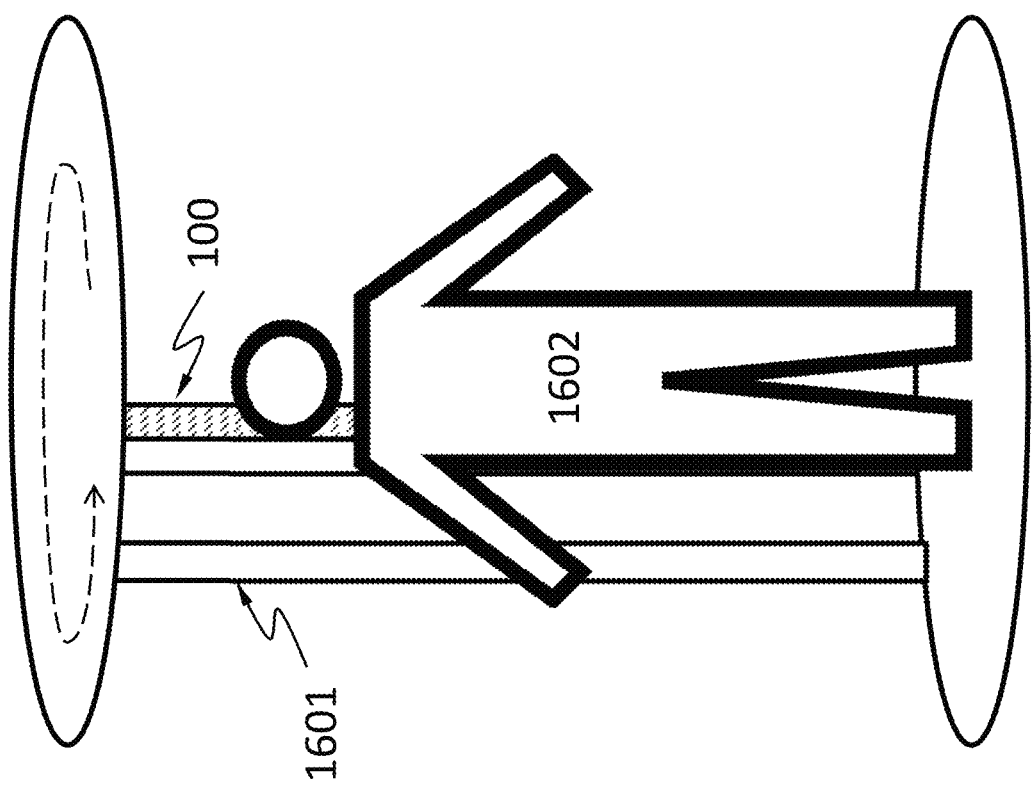
FIG. 15 schematically shows a full-body scanner system comprising the semiconductor X-ray detector described herein, according to an embodiment.

FIG. 15 schematically shows a full-body scanner system comprising the detector 100 described herein. The full-body scanner system may detect objects on a person's body for security screening purposes, without physically removing clothes or making physical contact. The full-body scanner system may be able to detect non-metal objects. The full-body scanner system comprises an X-ray source 1601. X-ray emitted from the X-ray source 1601 may backscatter from a human 1602 being screened and objects thereon, and be projected to the detector 100. The objects and the human body may backscatter X-ray differently. The semiconductor X-ray detector 100 forms an image by detecting the intensity distribution of the backscattered X-ray. The detector 100 and the X-ray source 1601 may be configured to scan the human in a linear or rotational direction.

Figure 16:
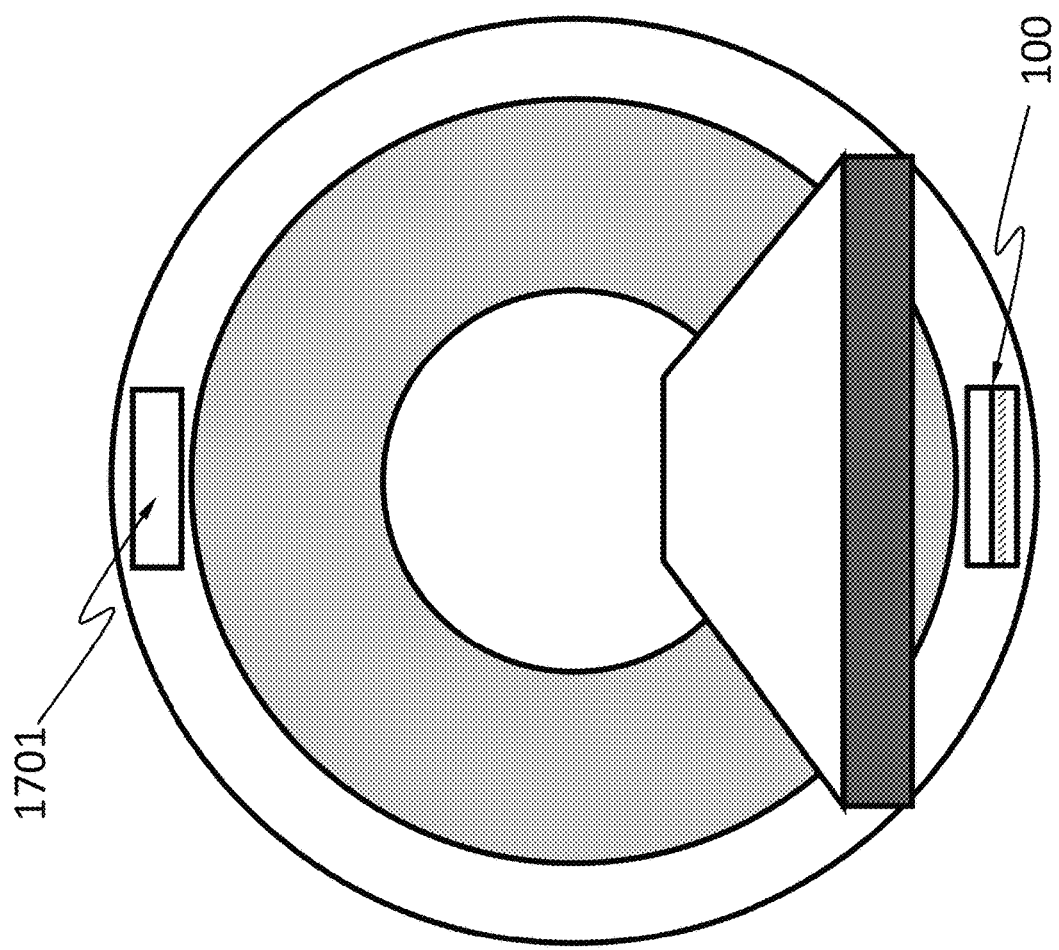
FIG. 16 schematically shows an X-ray computed tomography (X-ray CT) system comprising the semiconductor X-ray detector described herein, according to an embodiment.

FIG. 16 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the detector 100 described herein and an X-ray source 1701. The detector 100 and the X-ray source 1701 may be configured to rotate synchronously along one or more circular or spiral paths.

FIG. 17 schematically shows an electron microscope. The electron microscope comprises an electron source 1801 (also called an electron gun) that is configured to emit electrons. The electron source 1801 may have various emission mechanisms such as thermionic, photocathode, cold emission, or plasmas source. The emitted electrons pass through an electronic optical system 1803, which may be configured to shape, accelerate, or focus the electrons. The electrons then reach a sample 1802 and an image detector may form an image therefrom. The electron microscope may comprise the detector 100 described herein, for performing energy-dispersive X-ray spectroscopy (EDS). EDS is an analytical technique used for the elemental analysis or chemical characterization of a sample. When the electrons incident on a sample, they cause emission of characteristic X-rays from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from the sample can be measured by the detector 100.

The semiconductor X-ray detector 100 described here may have other applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this detector 100 in place of a photographic plate, a photographic film, a PSP plate, an X-ray image intensifier, a scintillator, or another semiconductor X-ray detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus suitable for detecting an image, comprising:
    a plurality of pixels configured to generate an electric signal upon exposure to a radiation;
    an electronics system associated with each of the pixels,
    wherein the electronics system comprises a first memory on a first signal path and a second memory on a second signal path, both signal paths being between an input terminal and an output terminal of the electronics system;
    wherein each of the first memory and the second memory is configured to store the electric signal generated by the pixel the electronics system is associated with, configured to store the electric signal generated in another pixel, and configured to transmit the electric signal stored in the electronics system to another pixel;
    wherein the electronics system comprises a switch configured to select the first signal path or the second signal path.

2. The apparatus of claim 1, wherein the input terminal is configured to receive signal into the electronics system and the output terminal is configured to transmit signal stored in the electronics system to downstream circuitry.

3. The apparatus of claim 1, wherein the first signal path is selected unless the first memory is defective.

4. The apparatus of claim 1, wherein the second signal path is selected when the first memory is defective.

5. The apparatus of claim 1, wherein the apparatus is configured to detect an X-ray image.

6. The apparatus of claim 1, wherein the electronics system comprises a third memory configured to store a code representing a defectiveness state and a selection of the signal path.

7. The apparatus of claim 6, wherein the third memory has redundant memories.

8. The apparatus of claim 7, wherein the apparatus is configured to select between the redundant memories, collectively for a group of electronics systems.

9. The apparatus of claim 1, further comprising a third memory configured to store codes representing defectiveness states and selection of signal paths of the electronics systems.

10. The apparatus of claim 9, wherein the third memory is a non-volatile memory.

11. The apparatus of claim 9, further comprising a controller configured to select the signal paths in the plurality of electronics systems based on the codes.

12. The apparatus of claim 11, wherein the third memory is a removable dongle.

13. The apparatus of claim 12, wherein the apparatus is disabled unless the removable dongle is present.

14. The apparatus of claim 1,
    wherein the electronics system comprises a bypass path that connects the input terminal and the output terminal, without any memory on the bypass path;
    wherein the switch is further configured to select the first signal path, the second signal path or the bypass path.

15. An apparatus suitable for detecting an image, comprising:
    a plurality of pixels configured to generate an electric signal upon exposure to a radiation;
    an electronics system associated with each of the pixels,
    wherein the electronics system comprises a first memory on a signal path between an input terminal and an output terminal of the electronics system,
    wherein the first memory configured to store the electric signal generated by the pixel the electronics system is associated with, configured to store the electric signal generated in another pixel, and configured to transmit the electric signal stored in the electronics system to another pixel;
    wherein the electronics system comprises a bypass path that connects the input terminal and the output terminal, without any memory on the bypass path;
    wherein the electronics system comprises a switch configured to select the signal path or the bypass path.

16. The apparatus of claim 15, wherein the input terminal is configured to receive signal into the electronics system and the output terminal is configured to transmit signal stored in the electronics system to downstream circuitry.

17. The apparatus of claim 15, wherein the signal path is selected unless the first memory is defective.

18. The apparatus of claim 15, wherein the apparatus is configured to detect an X-ray image.

19. The apparatus of claim 15, wherein the electronics system comprises a third memory configured to store a code representing a defectiveness state and a selection of the signal path or the bypass path.

20. The apparatus of claim 19, wherein the third memory is a non-volatile memory.

21. The apparatus of claim 15, comprising a third memory configured to store codes representing defectiveness states and selection of signal paths or the bypass paths of the electronics systems.

22. The apparatus of claim 21, wherein the third memory is a non-volatile memory.

23. The apparatus of claim 21, comprising a controller configured to select the signal paths or the bypass paths in the plurality of electronics systems based on the codes.

* * * * *